US012576373B2

(12) United States Patent
Vogtmann

(10) Patent No.: US 12,576,373 B2
(45) Date of Patent: Mar. 17, 2026

(54) FLUID DELIVERY MODULE

(71) Applicant: Ichor Systems, Inc., Fremont, CA (US)

(72) Inventor: Michael Vogtmann, Templeton, CA (US)

(73) Assignee: Ichor Systems, Inc.

( * ) Notice: Subject to any disclaimer, the term of this patent is extended or adjusted under 35 U.S.C. 154(b) by 490 days.

(21) Appl. No.: 18/147,965

(22) Filed: Dec. 29, 2022

(65) Prior Publication Data

US 2023/0241563 A1 Aug. 3, 2023

Related U.S. Application Data

(60) Provisional application No. 63/304,171, filed on Jan. 28, 2022.

(51) Int. Cl.
| | |
|---|---|
| *B01F 25/00* | (2022.01) |
| *B01F 25/43* | (2022.01) |
| *H01L 21/67* | (2006.01) |
| *B01F 101/58* | (2022.01) |

(52) U.S. Cl.
CPC ........ *B01F 25/43* (2022.01); *H01L 21/67017* (2013.01); *B01F 2025/914* (2022.01); *B01F 2101/58* (2022.01)

(58) Field of Classification Search
CPC B01F 25/43; B01F 2101/58; B01F 2025/914; H01L 21/67017
See application file for complete search history.

(56) References Cited

U.S. PATENT DOCUMENTS

| | | | |
|---|---|---|---|
| 4,255,124 | A | 3/1981 | Baranowski, Jr. |
| 4,929,088 | A | 5/1990 | Smith |
| 4,981,368 | A | 1/1991 | Smith |
| 5,492,404 | A | 2/1996 | Smith |
| 6,209,856 | B1 | 4/2001 | Kojima |
| 6,604,850 | B1 | 8/2003 | Schneider et al. |
| 7,243,641 | B2 | 7/2007 | Zukouski |
| 7,510,172 | B2 | 3/2009 | Kojima |
| 7,975,991 | B2 | 7/2011 | Kojima |
| 8,740,450 | B2 | 6/2014 | Mogami et al. |
| 9,403,139 | B2 | 8/2016 | Muller |

(Continued)

FOREIGN PATENT DOCUMENTS

| | | | |
|---|---|---|---|
| EP | 2102104 | A1 | 9/2009 |
| JP | H06277480 | A | 10/1994 |

(Continued)

OTHER PUBLICATIONS

International Search Report and Written Opinion of PCT/US2022/054259 Issued Jun. 21, 2023.

*Primary Examiner* — Anshu Bhatia
(74) *Attorney, Agent, or Firm* — The Belles Group, P.C.

(57) ABSTRACT

Apparatuses for controlling fluid flow are important components for delivering process fluids for semiconductor fabrication. These apparatuses for controlling fluid flow are formed with a variety of fluid flow components, including fluid flow components for mixing fluid flows. Fluid flow components for mixing flows utilize mixing elements configured to receive flows of two or more process fluid flows via fluid inlets, mix the fluid flow within the mixing element, and deliver mixed fluid to a down-stream fluid flow component or an outlet of an apparatus for controlling fluid flow.

18 Claims, 22 Drawing Sheets

(56) References Cited

U.S. PATENT DOCUMENTS

| | | | |
|---|---|---|---|
| 9,902,620 | B2 | 2/2018 | Fournier et al. |
| 2002/0191486 | A1* | 12/2002 | Min ........................ B01F 27/71 |
| | | | 366/168.1 |
| 2008/0302433 | A1 | 12/2008 | Taskar |
| 2009/0034361 | A1 | 2/2009 | Trang et al. |
| 2014/0182726 | A1* | 7/2014 | Yasuda ................... B01F 23/10 |
| | | | 137/833 |
| 2017/0168510 | A1 | 6/2017 | Ye et al. |

FOREIGN PATENT DOCUMENTS

| | | | |
|---|---|---|---|
| JP | 2014128755 | A | 7/2014 |
| JP | 2015004110 | A | 1/2015 |

\* cited by examiner

FLUID DELIVERY MODULE

CROSS-REFERENCE TO RELATED APPLICATIONS

This application claims the benefit of U.S. Provisional Application 63/304,171, filed Jan. 28, 2022, which is incorporated herein by reference in its entirety.

BACKGROUND

Flow control has been one of the key technologies in semiconductor chip fabrication. Apparatuses for controlling fluid flow are important for delivering flows of process fluids for semiconductor fabrication and other industrial processes. Such devices are used to measure and accurately control the flow of fluids for a variety of applications. This control relies on apparatuses which are designed for increased packaging density and improved functional performance.

As the technology of chip fabrication has improved, the component size has decreased and packaging requirements have become tighter for the apparatuses for controlling flow. Improvement of functional performance and decreased space requirements have driven improvements in all manner of flow control devices. In order to improve the functional performance of flow control devices improved methods and equipment are desired.

BRIEF SUMMARY

The present technology is directed to a fluid delivery module comprising an apparatus for controlling flow. The apparatus for controlling flow includes a flow component which includes a mixing element to mix two or more fluids and deliver the resulting fluid mixture to process chamber. Apparatuses for controlling flow may incorporate a wide number of fluid flow components to perform a wide range of control functions beyond mixing. Where mixing is required, it is desirable to achieve the most complete mixing possible in order to ensure the fluid mixtures so delivered are homogenous and behave in predictable ways. Such apparatuses may be used in a wide range of processes such as semiconductor chip fabrication, solar panel fabrication, and the like.

In one implementation, the invention is a system for processing articles. The system has a first fluid supply configured to supply a first process fluid, a second fluid supply configured to supply a second process fluid, a process chamber configured to process articles, and a fluid delivery module. The fluid delivery module has a first inlet fluidly coupled to the first fluid supply, a second inlet fluidly coupled to the second fluid supply, an outlet fluidly coupled to the process chamber, a flow passage extending from the first and second fluid inlets to the outlet, and a first flow component. The first flow component has a component body, a first port, a second port, and a third port. Each of the first, second, and third ports are formed in the component body, a first flow path extending from the first port to a junction, a second flow path extending from the second port to the junction, and a third flow path extending from the junction to the third port. The first, second, and third flow paths each form a portion of the flow passage. The first flow component further has a mixing element, the mixing element located at the junction of the first flow component. The mixing element has a first fluid inlet, a second fluid inlet, and a fluid outlet, the first fluid inlet fluidly coupled to the first port, the second fluid inlet fluidly coupled to the second port, and the fluid outlet fluidly coupled to the third port.

In another implementation, the invention is a fluid flow component. The fluid flow component has a component body, a first port, a second port, and a third port. Each of the first, second, and third ports are formed in the component body. A first flow path extends from the first port to a junction. A second flow path extends from the second port to the junction. A third flow path extends from the junction to the third port. A mixing element is located at the junction. The mixing element has a first fluid inlet fluidly coupled to the first port, a second fluid inlet fluidly coupled to the second port, and a fluid outlet fluidly coupled to the third port.

In yet another implementation, the invention is a mixing element. The mixing element has a tubular body extending along a longitudinal axis of the mixing element from an open end to a closed end. The tubular body has an outer surface and an inner surface. The mixing element further includes a first fluid inlet formed through the tubular body from the outer surface to the inner surface and a second fluid inlet formed through the tubular body from the outer surface to the inner surface. A fluid outlet is formed by the open end of the tubular body.

In another implementation, the invention is a method of mixing process fluids. A first fluid supply is configured to supply a first process fluid and a second fluid supply is configured to supply a second process fluid. The first and second process fluids are flowed to a mixing element of a first flow component. The first and second process fluids are flowed through first and second fluid inlets formed in a tubular body of the mixing element. The first and second fluid inlets extend along first and second inlet axes perpendicular to a longitudinal axis of the mixing element. The first and second process fluids are comingled within the tubular body of the mixing element to form a fluid mixture. The fluid mixture is flowed through an open end of the tubular body, the open end forming an outlet of the mixing element.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein.

Figure 1:
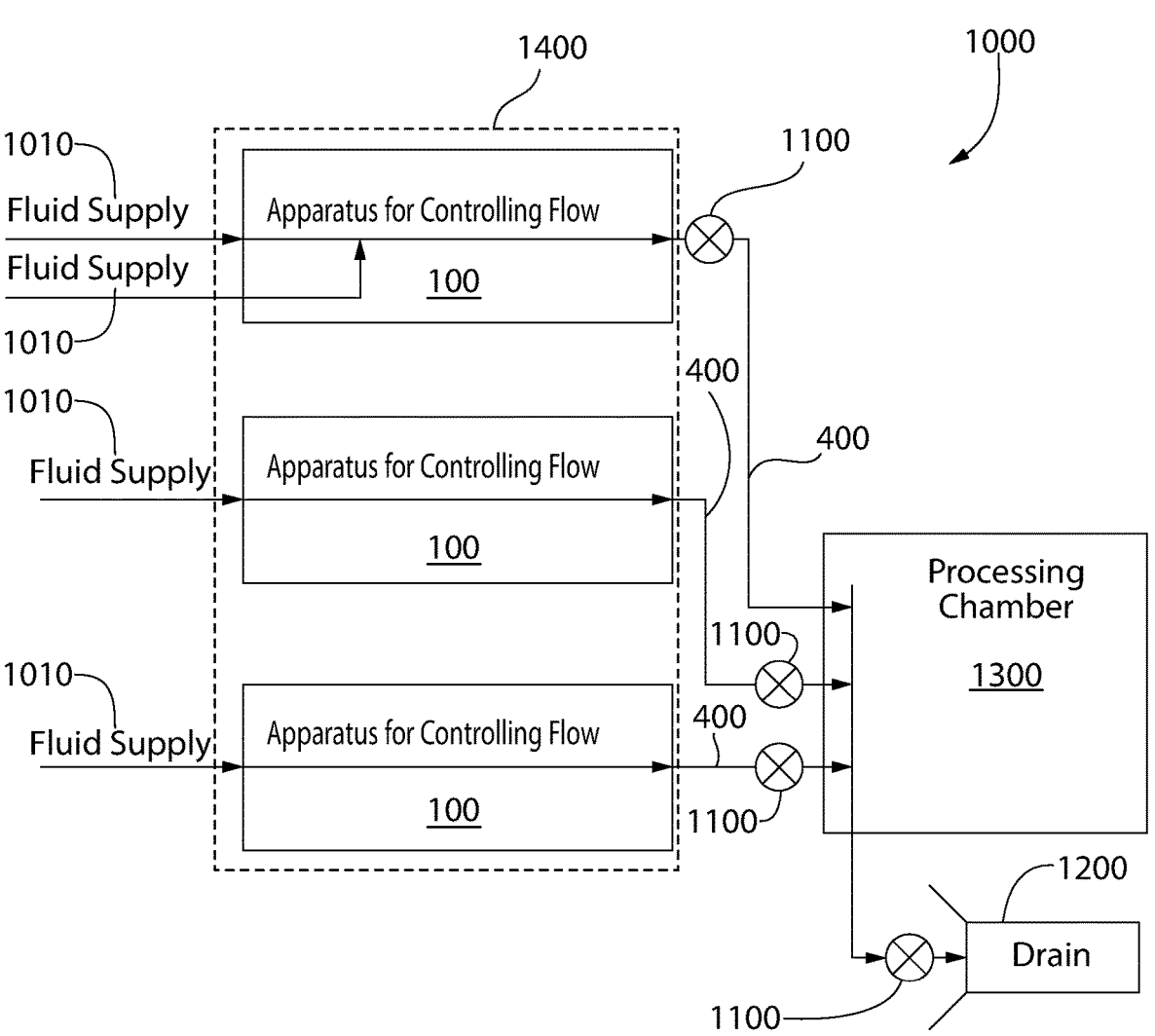
FIG. 1 is a schematic of a system for manufacturing semiconductor devices utilizing one or more apparatuses for controlling flow.

All drawings are schematic and not necessarily to scale. Features shown numbered in certain figures which may appear un-numbered in other figures are the same features unless noted otherwise herein.

DETAILED DESCRIPTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to a mixing element and associated flow components for use in a fluid delivery module and system. Semiconductor fabrication is one industry which demands high performance in control of fluid flows. As semiconductor fabrication techniques have advanced, customers have recognized the need for flow control devices with improved functional performance. Thus, mixing of fluids must be performed efficiently for a wide range of flows and with a high degree of homogeneity in the resulting fluid mixture. The present invention enables superior fluid mixing in semiconductor and similar processes.

FIG. 1 shows a schematic of an exemplary processing system 1000. The processing system 1000 may utilize a plurality of apparatus for controlling flow 100 fluidly coupled to a processing chamber 1300. The plurality of apparatus for controlling flow 100 are used to supply one or more different process fluids to the processing chamber 1300. Fluids are provided by a plurality of fluid supplies 1010. As can be seen, two or more fluid supplies 1010 can be connected to a single apparatus for controlling flow 100.

Collectively, the plurality of apparatus for controlling flow 100 belong to a fluid delivery module 1400. Optionally, more than one fluid delivery module 1400 may be utilized in the processing system 100. The plurality of apparatus for controlling flow 100 are connected to the processing chamber 1300 by an outlet manifold 400. Articles such as semiconductors and integrated circuits may be processed within the processing chamber 1300.

Valves 1100 isolate each of the apparatus for controlling flow 100 from the processing chamber 1300, enabling each of the apparatus for controlling flow 100 to be selectively connected or isolated from the processing chamber 1300, facilitating a wide variety of different processing steps. The processing chamber 1300 may contain an applicator to apply process fluids delivered by the plurality of apparatus for controlling flow 100, enabling selective or diffuse distribution of the fluids supplied by the plurality of apparatus for controlling flow 100. Optionally, the processing chamber 1300 may be a vacuum chamber or may be a tank or bath for immersing articles in the fluids supplied by the plurality of apparatus for controlling flow 100. A fluid supply line is formed by the flow path from each of the respective fluid supplies to the processing chamber 1300.

In addition, the processing system 1000 may further comprise a vacuum source or drain 1200 which is isolated from the processing chamber 1300 by a valve 1100 to enable evacuation of process fluids or facilitate purging one or more of the apparatus for controlling flow 100. This enables maintenance, switching between process fluids in the same apparatus for controlling flow 100, or other tasks. Optionally, the drain 1200 may be a liquid drain configured to remove liquids from the processing chamber 1300. Alternately, the drain 1200 may be a vacuum source for removing gases. Optionally, the apparatus for controlling flow 100 may be mass flow controllers, flow splitters, flow combiners, or any other device which controls the flow of a process fluid in a processing system. Furthermore, the valves 1100 may be integrated into the apparatus for controlling flow 100 if so desired. The processing chamber 1300 may house a semiconductor wafer for processing, among other articles.

Processes that may be performed in the processing system 1000 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, electroplating, or any other process utilizing gases or liquids.

Figure 2:
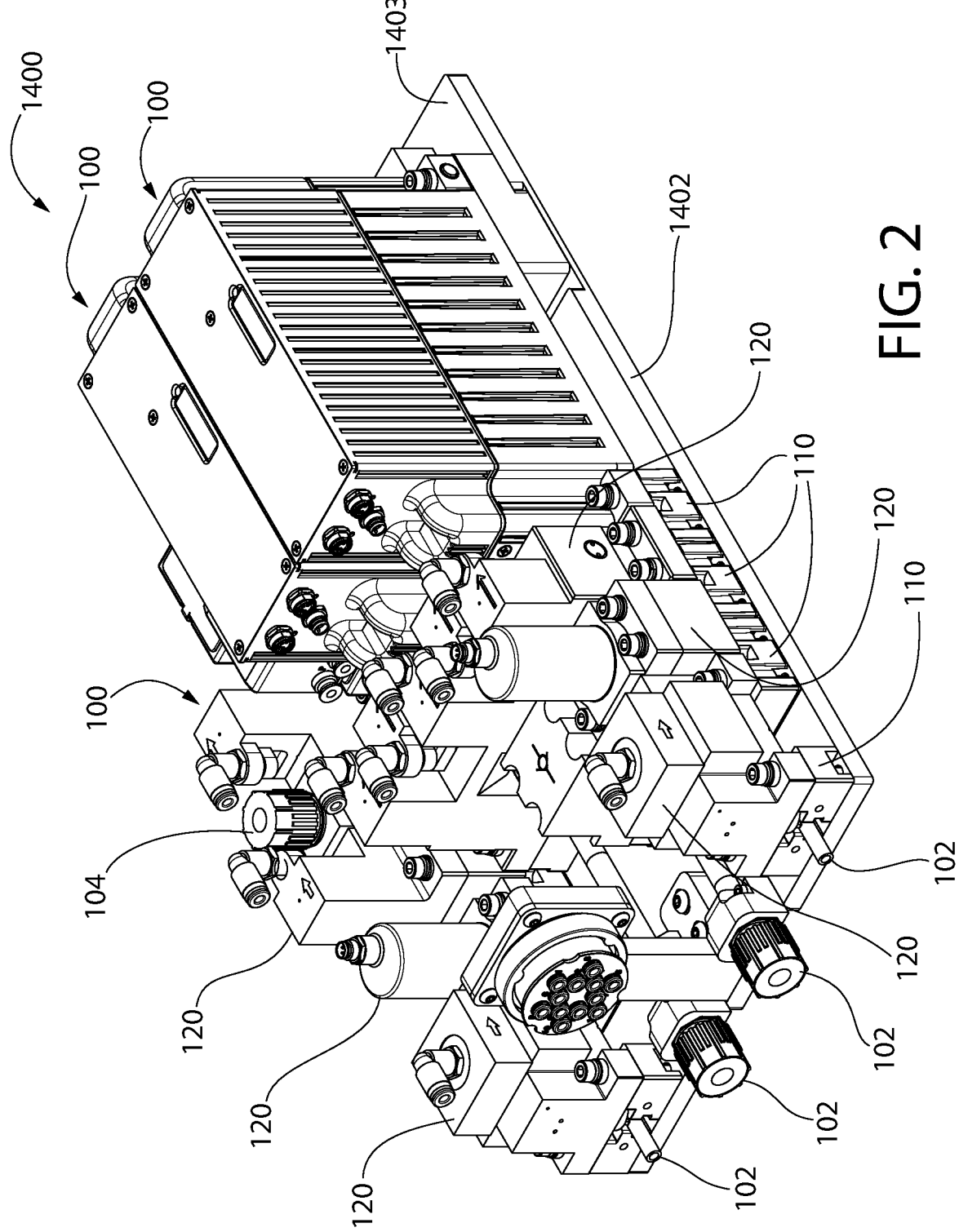
FIG. 2 is a perspective view of a fluid delivery module comprising a plurality of apparatuses for controlling flow as may be utilized in the process of FIG. 1.

FIG. 2 shows an exemplary fluid delivery module 1400 comprising a plurality of apparatus for controlling flow 100. The fluid delivery module 1400 comprises a support structure 1402. The support structure 1402 may be referred to as a base substrate or base plate and is generally a flat plate or sheet with one or more apparatuses for controlling flow 100 mounted thereon. In the present example, a plurality of apparatus for controlling flow 100 are mounted to the support structure. Each of the apparatus for controlling flow 100 are modular in design, and comprise a large number of individual fluid flow components 110, 120 which are each attached to the support structure 1402 either directly or indirectly. The support structure 1402 has a top surface 1403 onto which the apparatuses for controlling flow 100 are mounted.

Fluid flow components 110, 120 include active flow components 120 and passive flow components 110. Passive flow components 110 do not alter the flow of the fluid, but instead merely connect one active component to another or connect an active component to an inlet or outlet. Active flow components 120 may alter the flow of fluid, monitor an aspect of the fluid, or otherwise perform a function beyond mere fluid conveyance. Active flow components 120 may include temperature sensors, pressure transducers, mass flow controllers, valves, and the like. Yet other components may be both active and passive depending on their current use in an apparatus for controlling flow 100. For instance, a temperature sensor may also serve as a passive fluid flow component which conveys fluid from one active flow component 120 to another and may not actually be utilized to measure temperature sensor. As can be seen, a huge number of variations in fluid flow components 110, 120 can be conceived, and these fluid flow components 110, 120 can be used to assemble a wide range of apparatus for controlling flow 100.

The fluid delivery module 1400 comprises a plurality of inlets 102 which receive fluid from the fluid supplies 1010 discussed above. The fluid delivery module also has at least one outlet 104 which delivers fluid to the processing chamber 1300. Each apparatus for controlling flow 100 may have one inlet 102 and one outlet 104 or may have a plurality of inlets 102 or a plurality of outlets 104. Thus, fluid may flow through a plurality of inlets 102 and be delivered via a single outlet 104 or may flow through a single inlet 102 and be delivered via a plurality of outlets 104. The same fluid may be delivered to a plurality of inlets 102 or different fluids may be delivered to each inlet 102. The same inlet 102 or outlet 104 may be shared by a plurality of apparatus for controlling flow 100 or each apparatus for controlling flow 100 may have one or more dedicated inlets 102 and outlets 104.

Figure 3:
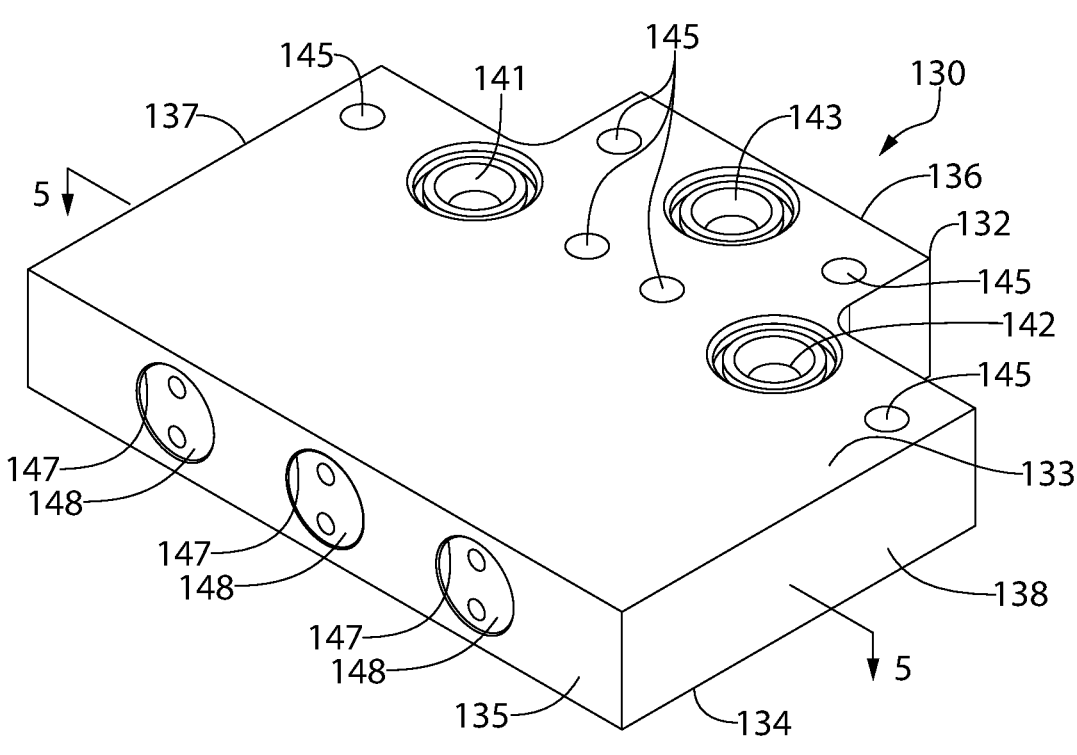
FIG. 3 is a perspective view of a flow component as may be utilized in the fluid delivery module of FIG. 2.
Figure 4:
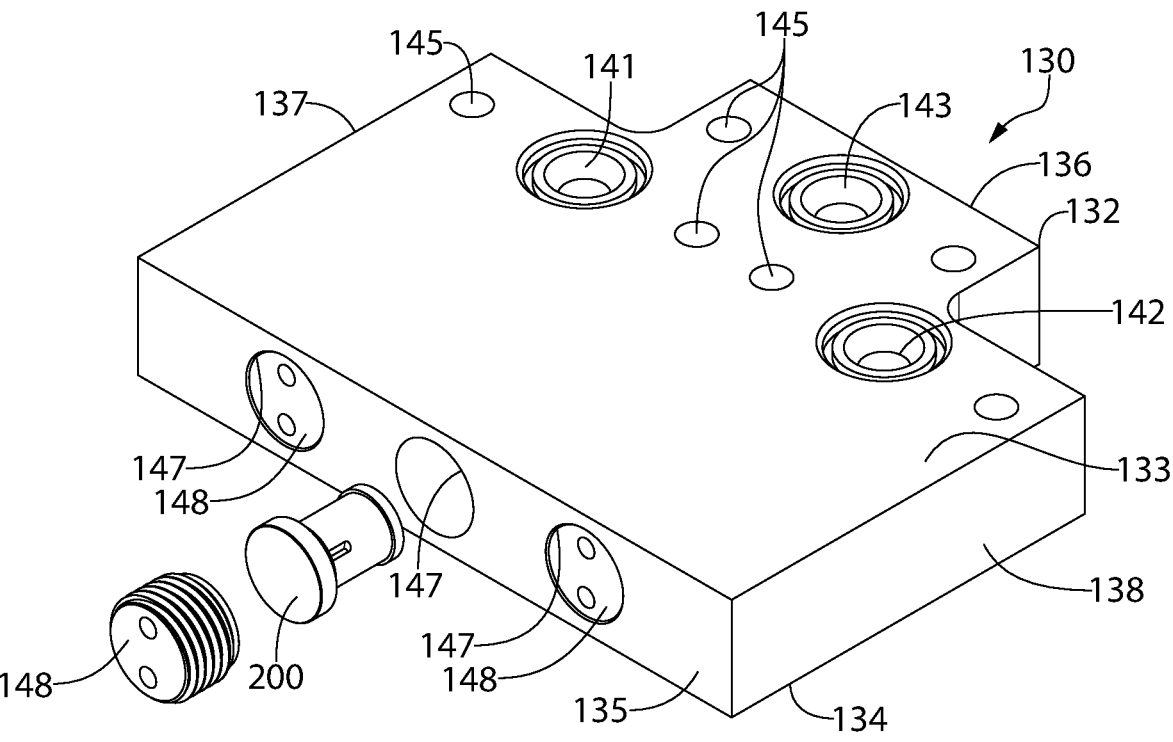
FIG. 4 is an exploded perspective view of the flow component of FIG. 3.
Figure 5:
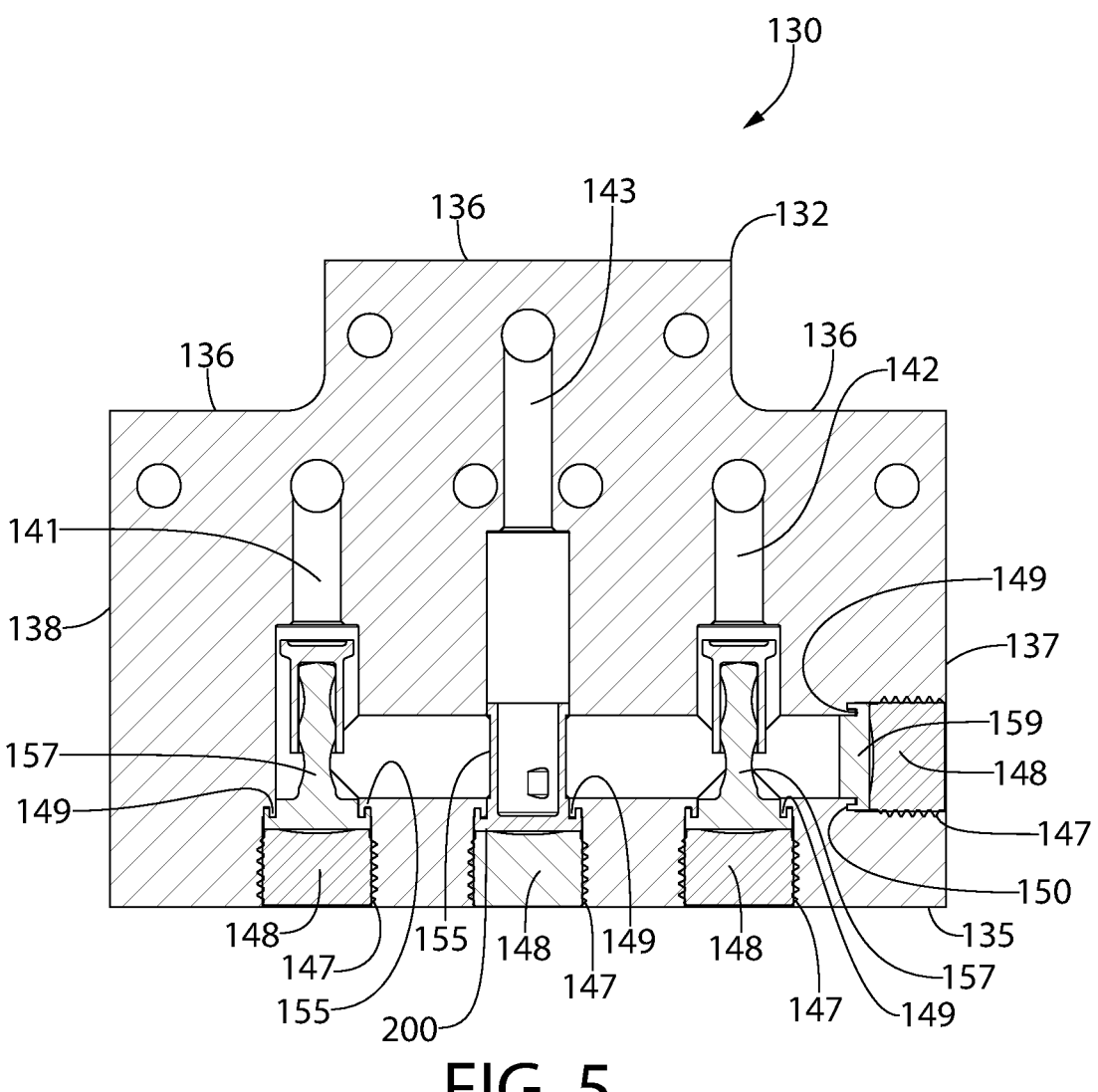
FIG. 5 is a cross-sectional view of the flow component of FIG. 3, taken along line 5-5.
Figures 6, 7:
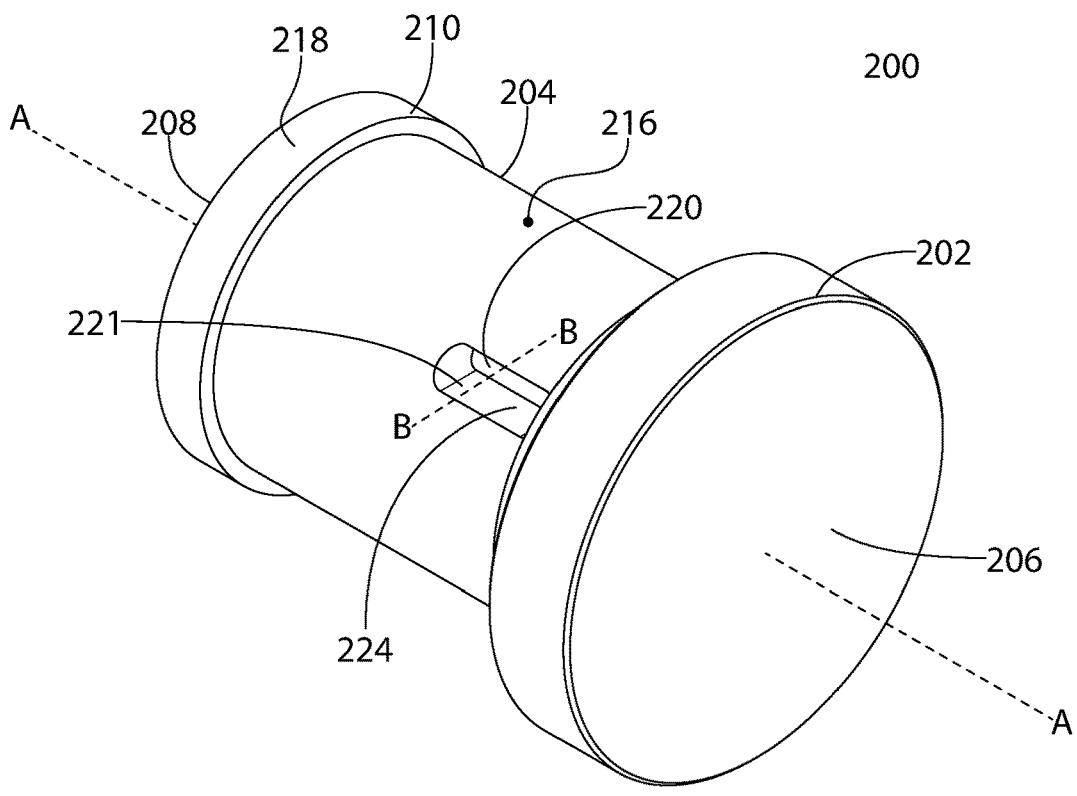
FIG. 6 is a perspective view of a mixing element as may be utilized in the flow component of FIG. 3.
FIG. 7 is a rear perspective view of the mixing element of FIG. 6.
Figure 8:
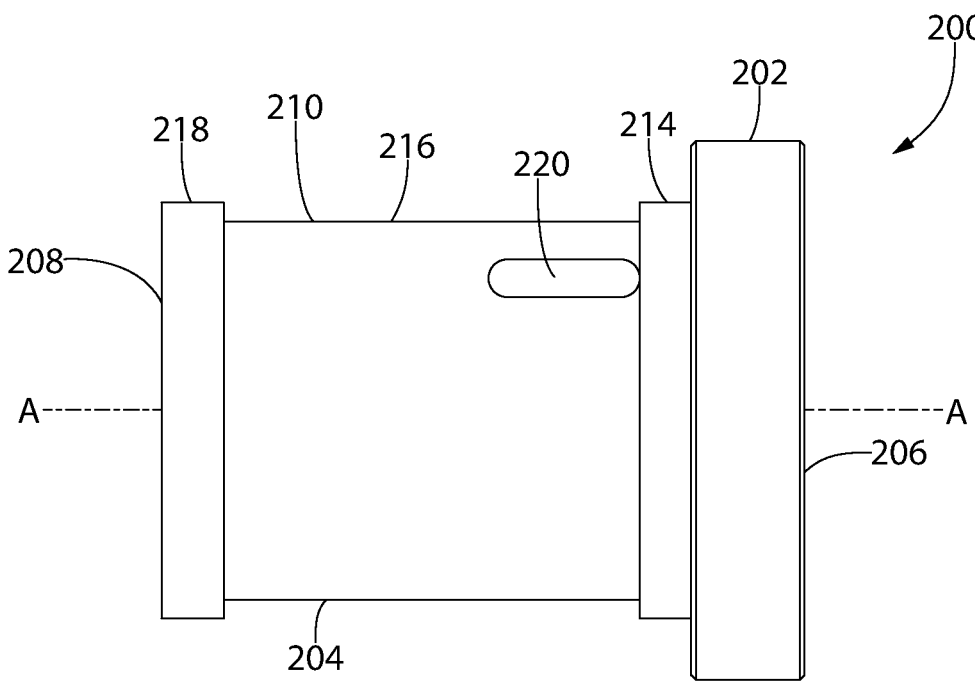
FIG. 8 is a left side view of the mixing element of FIG. 6.
Figure 9:
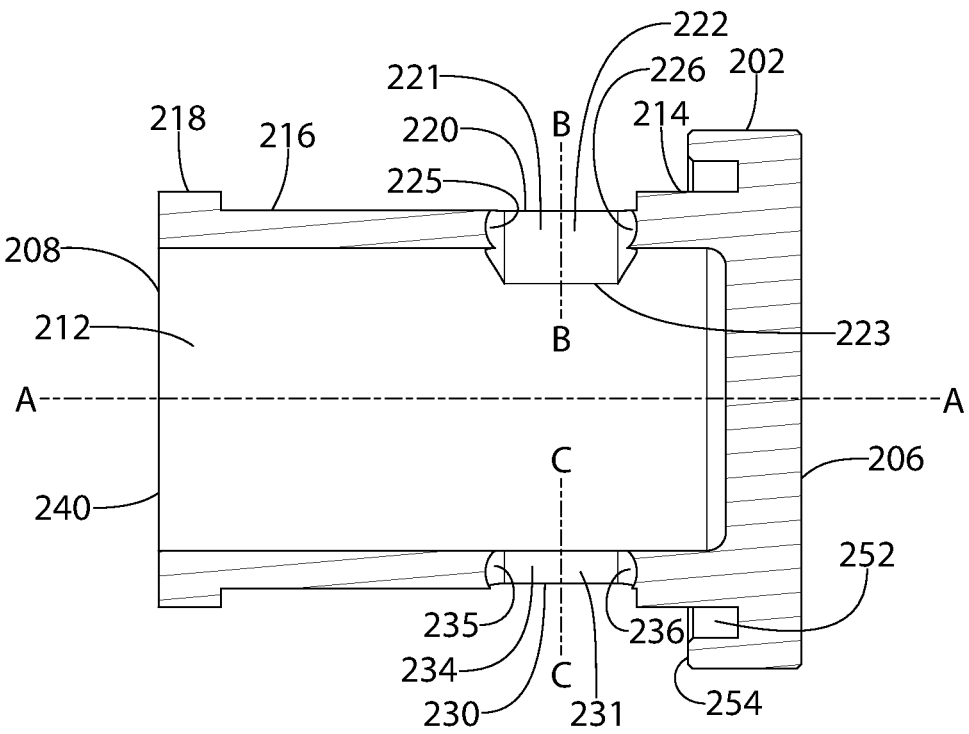
FIG. 9 is a cross-sectional view of the mixing element, taken along line 9-9 of FIG. 7.
Figure 10:
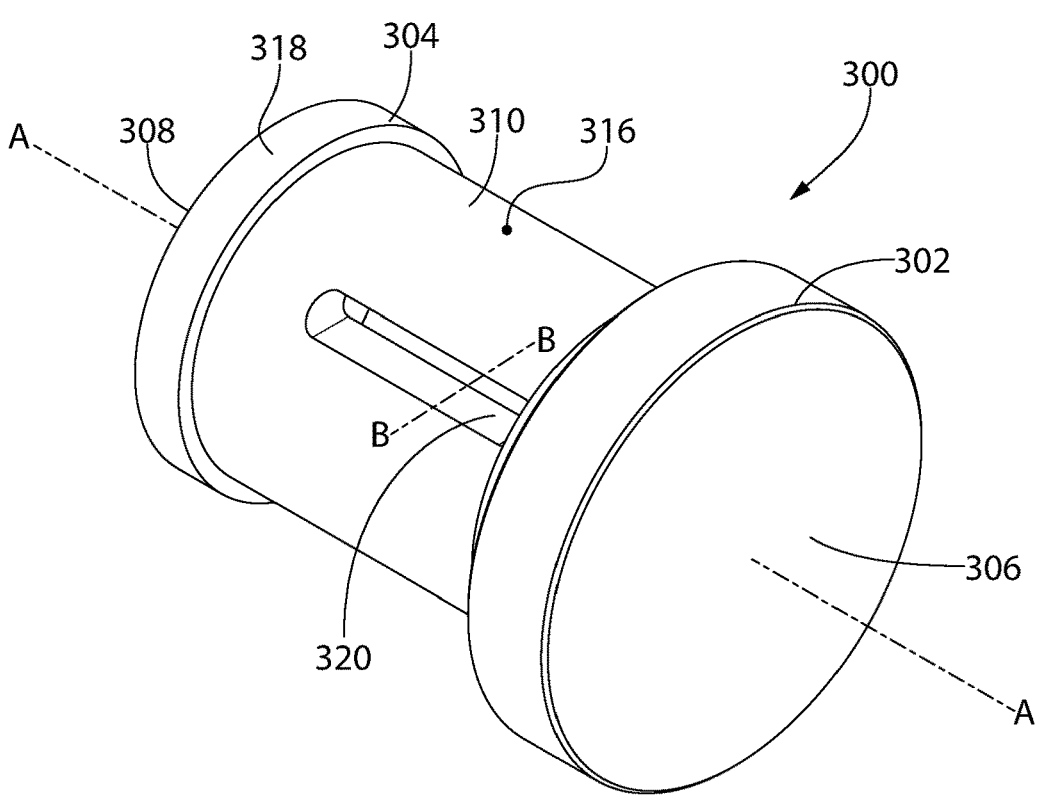
FIG. 10 is a perspective view of another embodiment of a mixing element as may be utilized in the flow component of FIG. 3.
Figure 11:
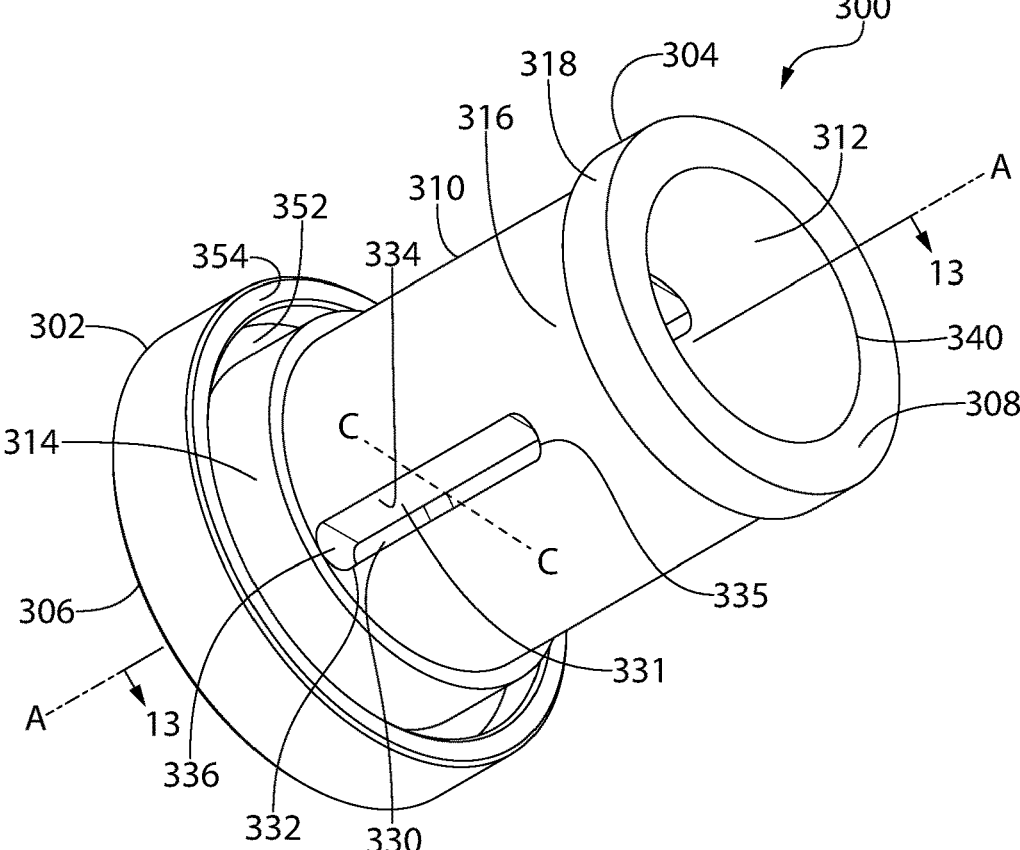
FIG. 11 is a rear perspective view of the mixing element of FIG. 10.
Figure 12:
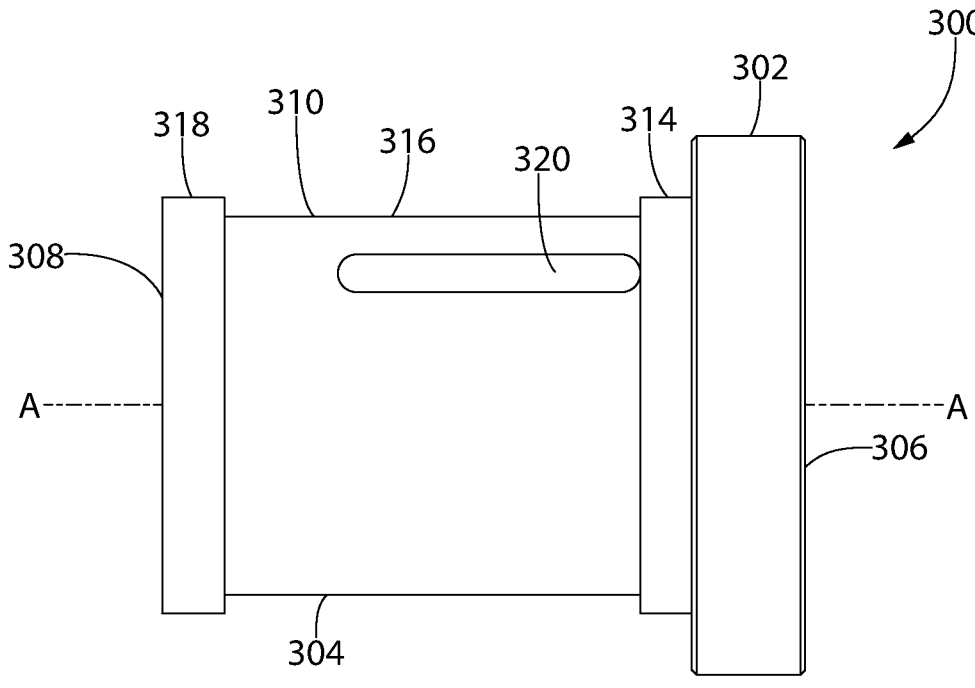
FIG. 12 is a left side view of the mixing element of FIG. 10.
Figure 13:
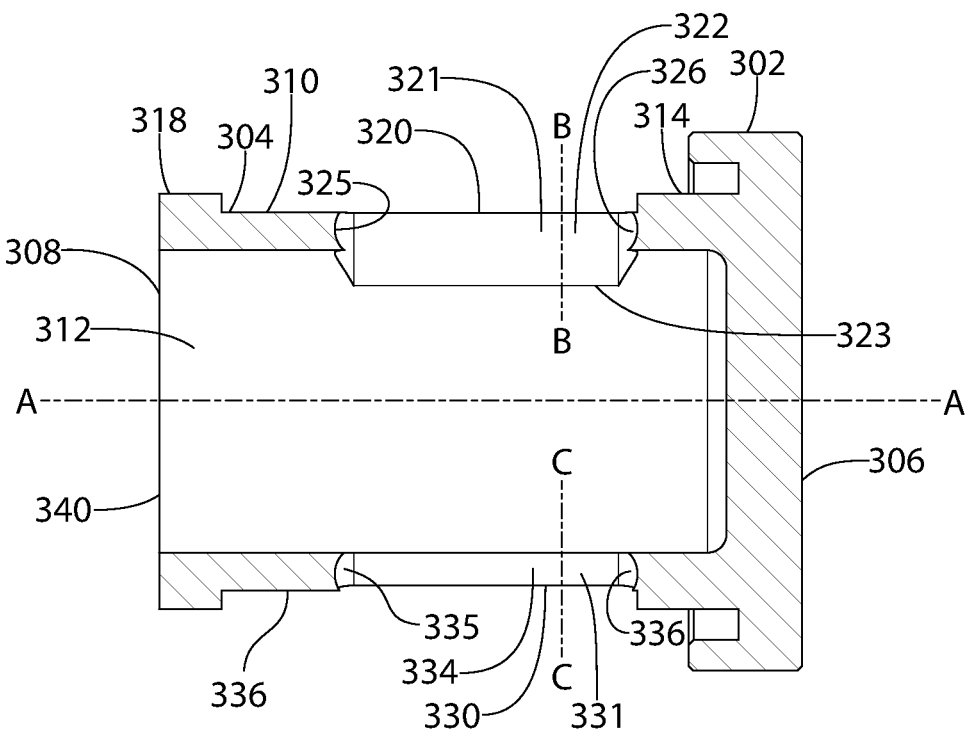
FIG. 13 is a cross-sectional view of the mixing element, taken along line 13-13 of FIG. 11.
Figure 14:
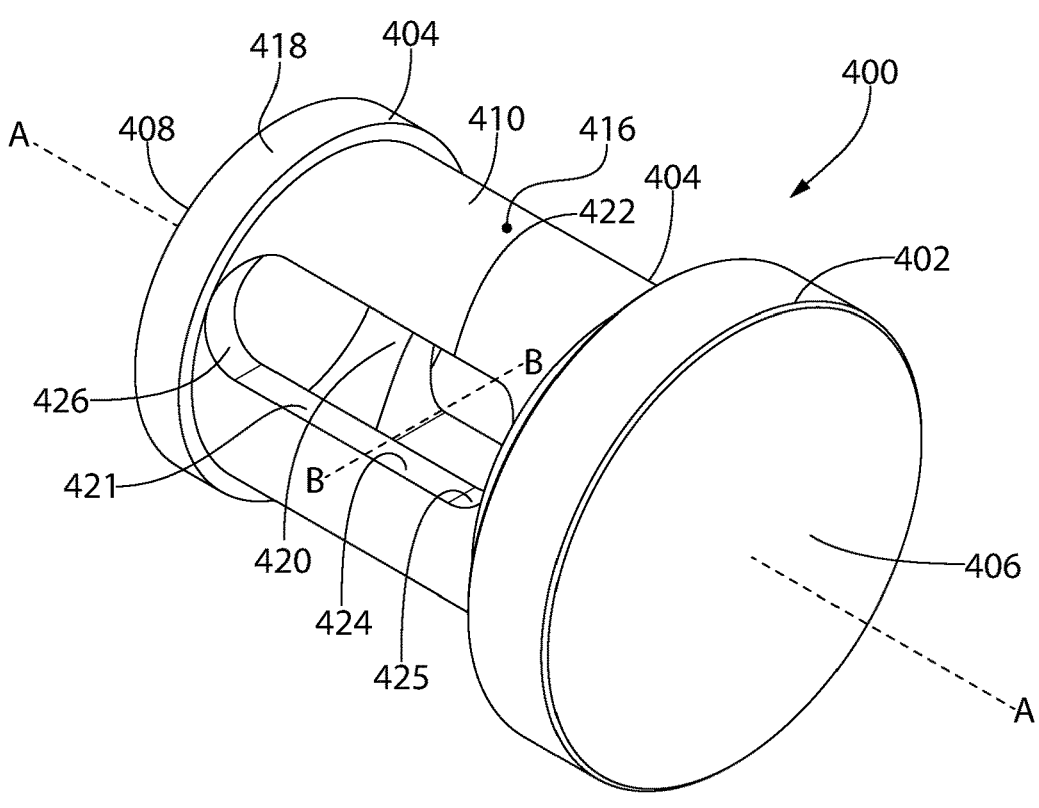
FIG. 14 is a perspective view of another embodiment of a mixing element as may be utilized in the flow component of FIG. 3.
Figure 15:
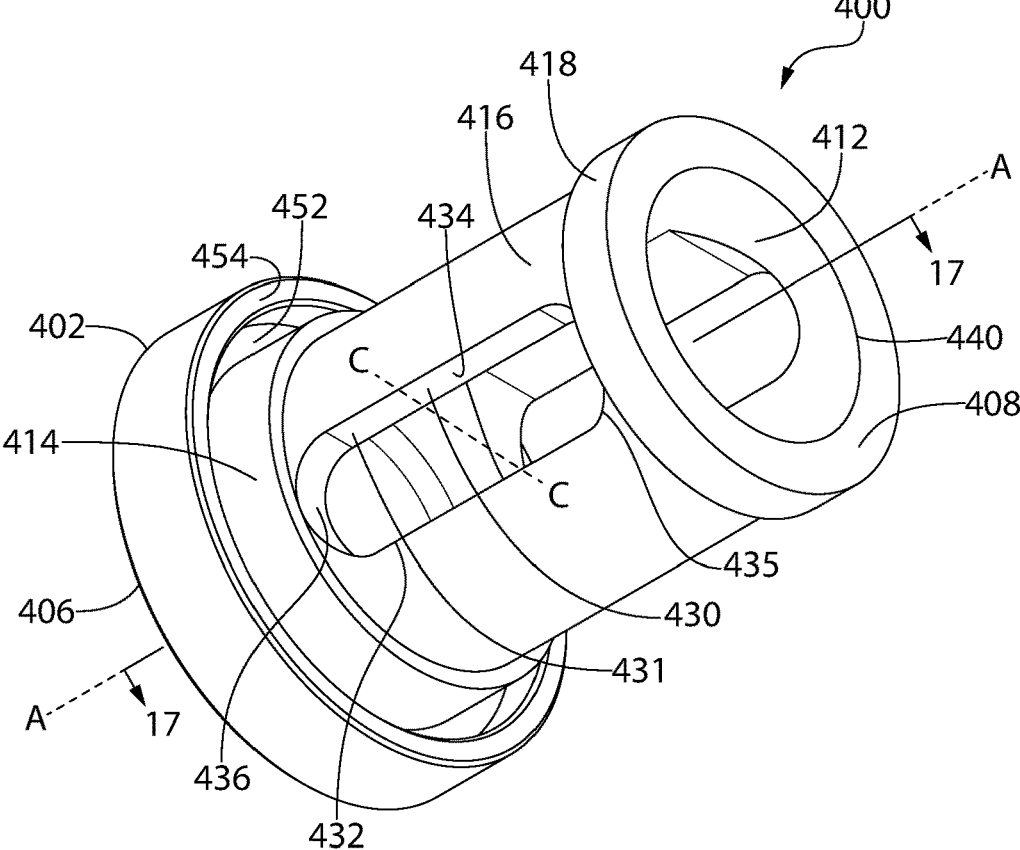
FIG. 15 is a rear perspective view of the mixing element of FIG. 14.
Figure 16:
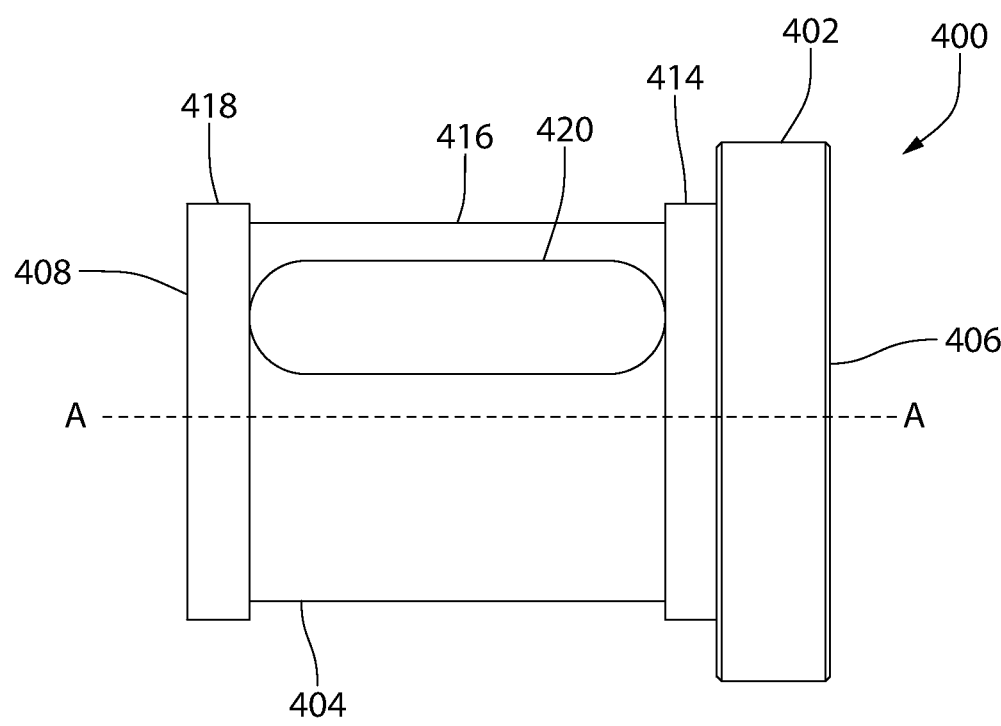
FIG. 16 is a left side view of the mixing element of FIG. 14.
Figure 17:
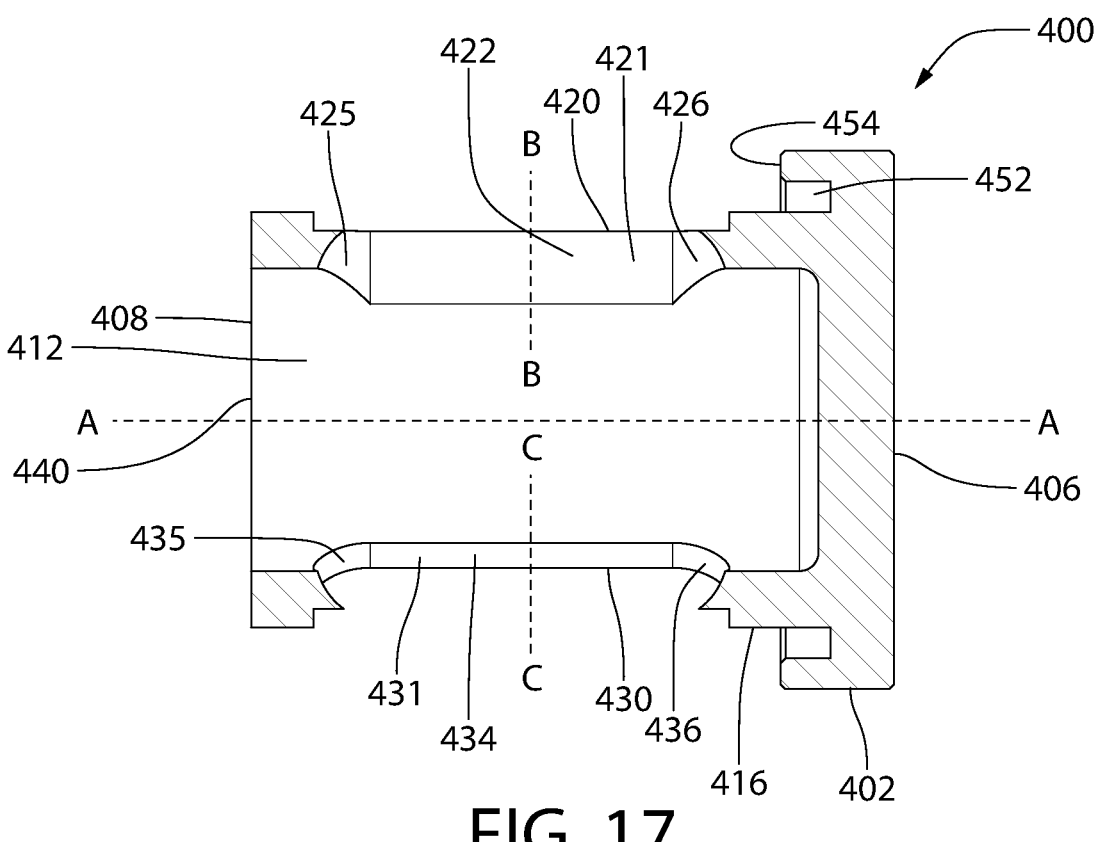
FIG. 17 is a cross-sectional view of the mixing element, taken along line 17-17 of FIG. 15.
Figures 18, 19:
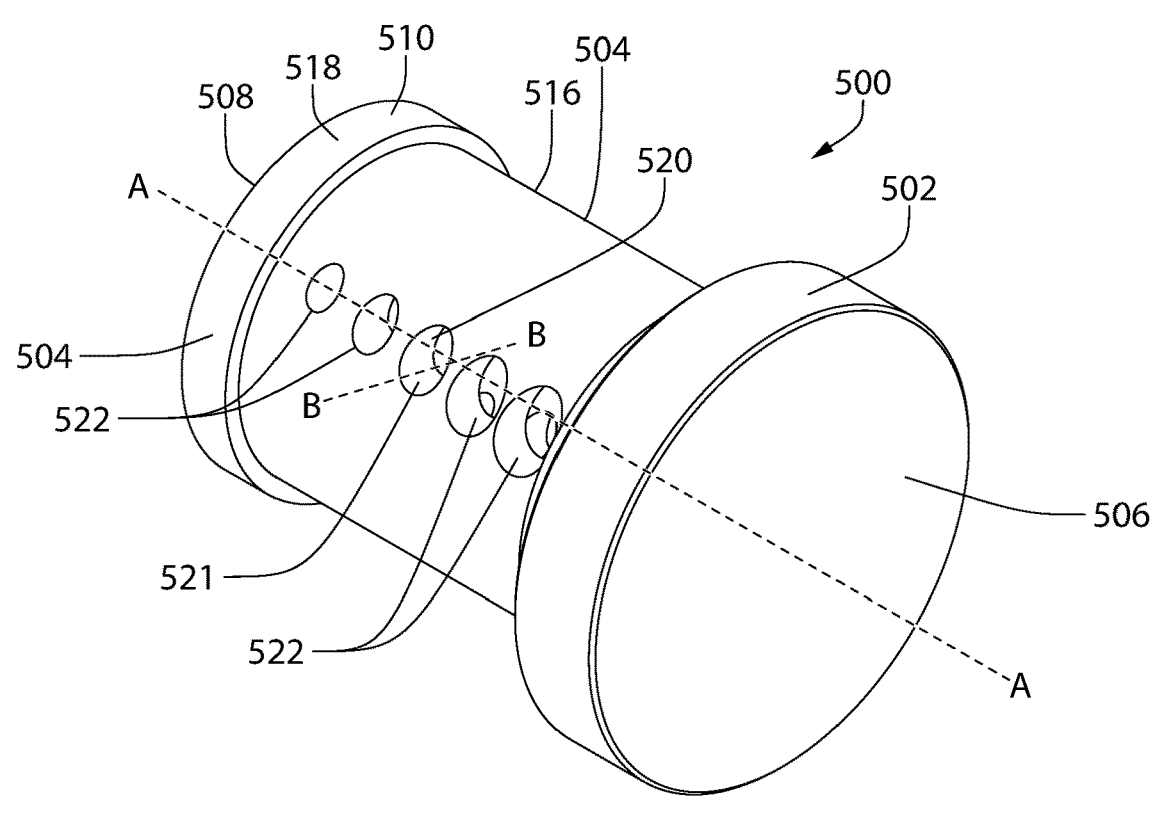
FIG. 18 is a perspective view of another embodiment of a mixing element as may be utilized in the flow component of FIG. 3.
FIG. 19 is a rear perspective view of the mixing element of FIG. 18.
Figure 20:
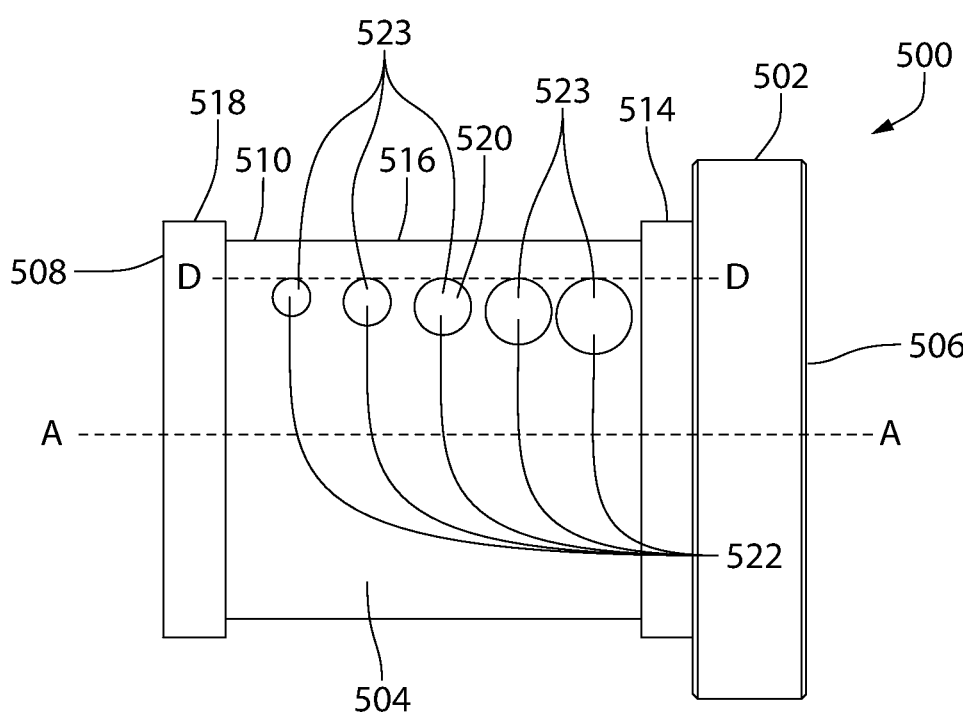
FIG. 20 is a left side view of the mixing element of FIG. 18.
Figure 21:
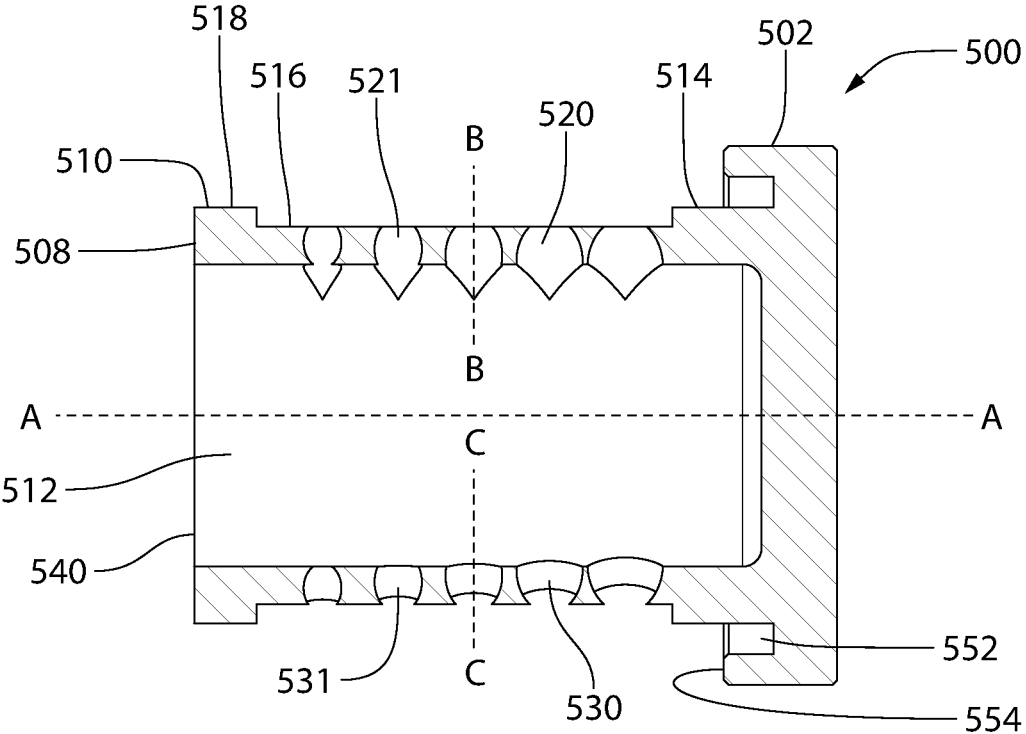
FIG. 21 is a cross-sectional view of the mixing element, taken along line 21-21 of FIG. 19.
Figure 22:
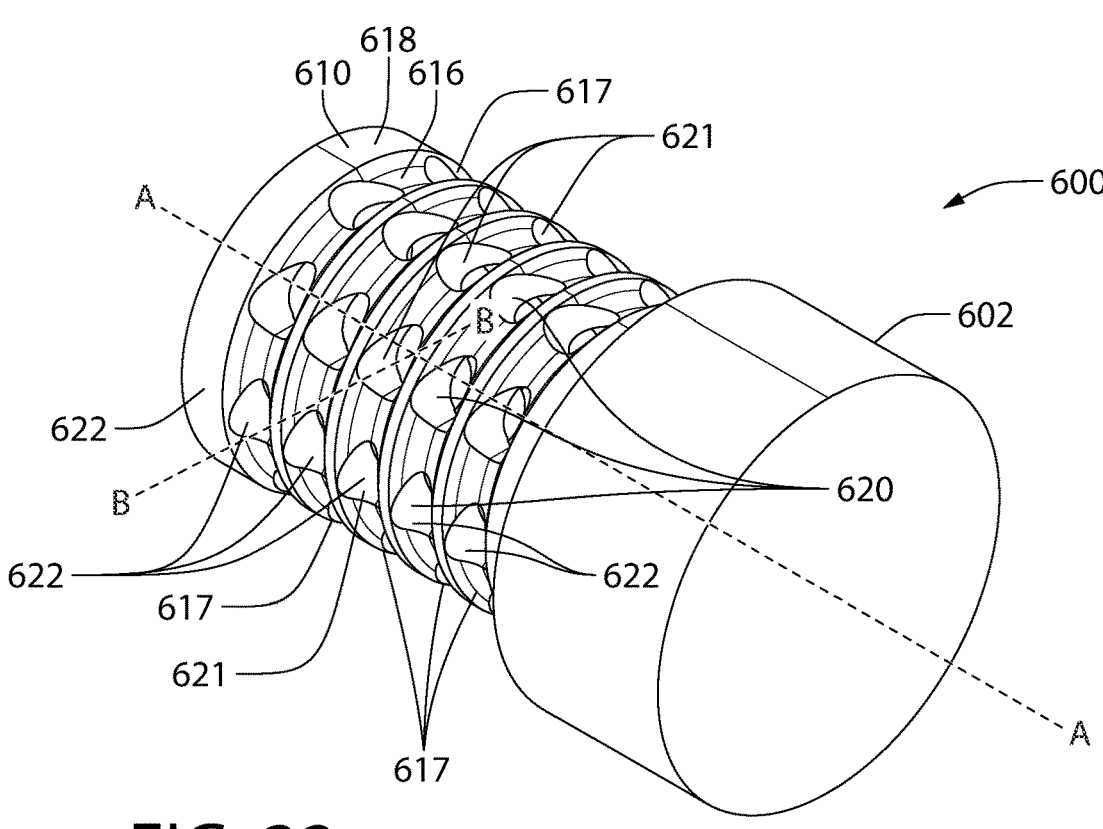
FIG. 22 is a perspective view of another embodiment of a mixing element as may be utilized in the flow component of FIG. 3.
Figure 23:
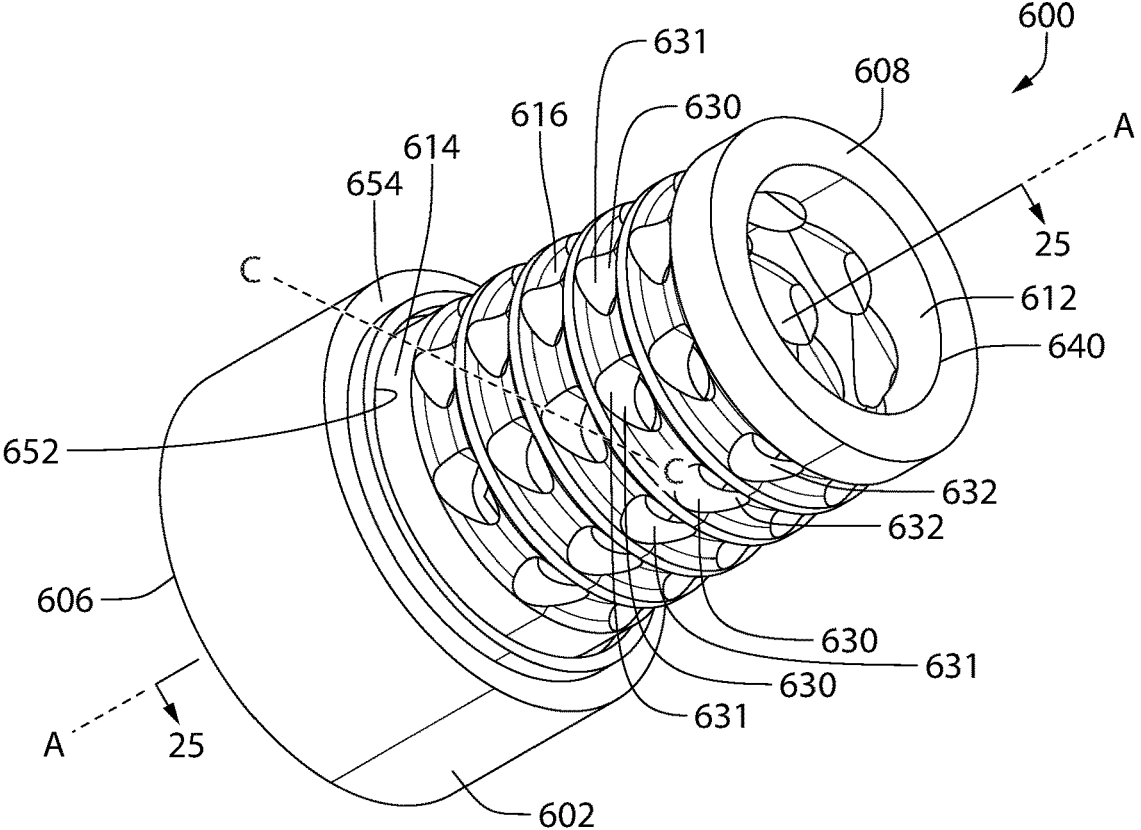
FIG. 23 is a rear perspective view of the mixing element of FIG. 22.
Figure 24:
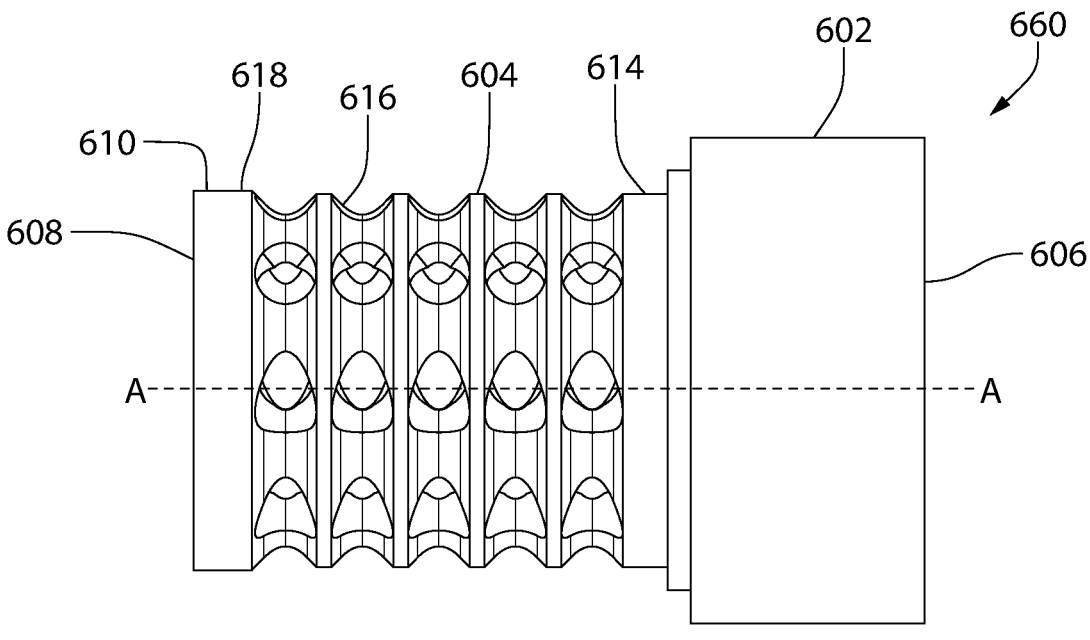
FIG. 24 is a left side view of the mixing element of FIG. 22.
Figure 25:
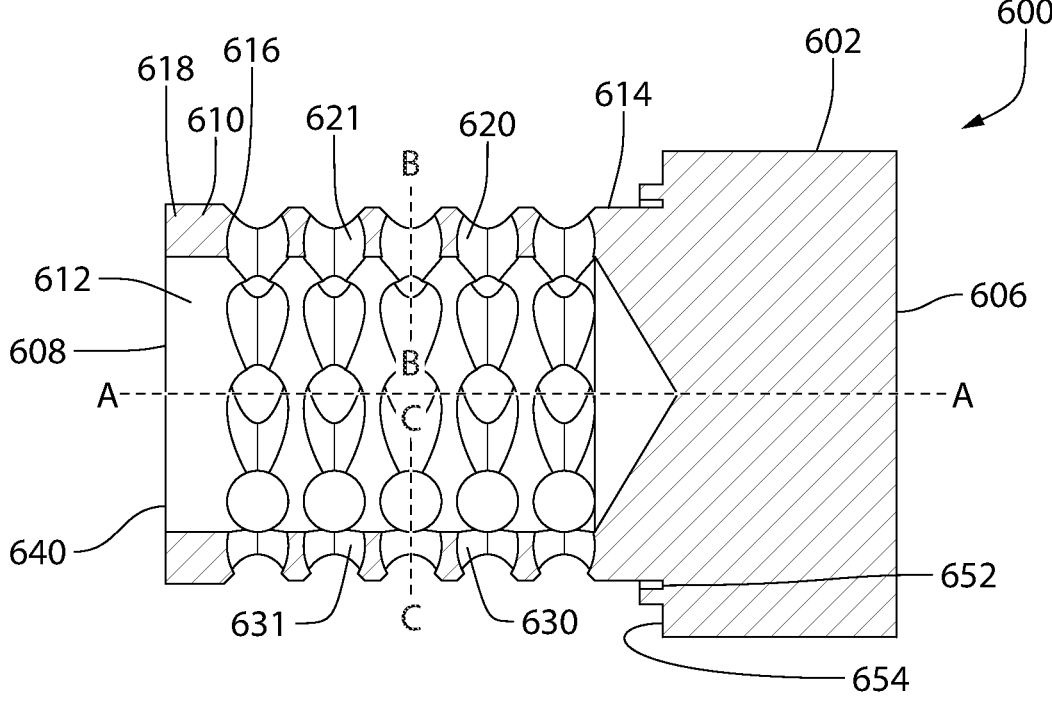
FIG. 25 is a cross-sectional view of the mixing element, taken along line 25-25 of FIG. 23.
Figure 26:
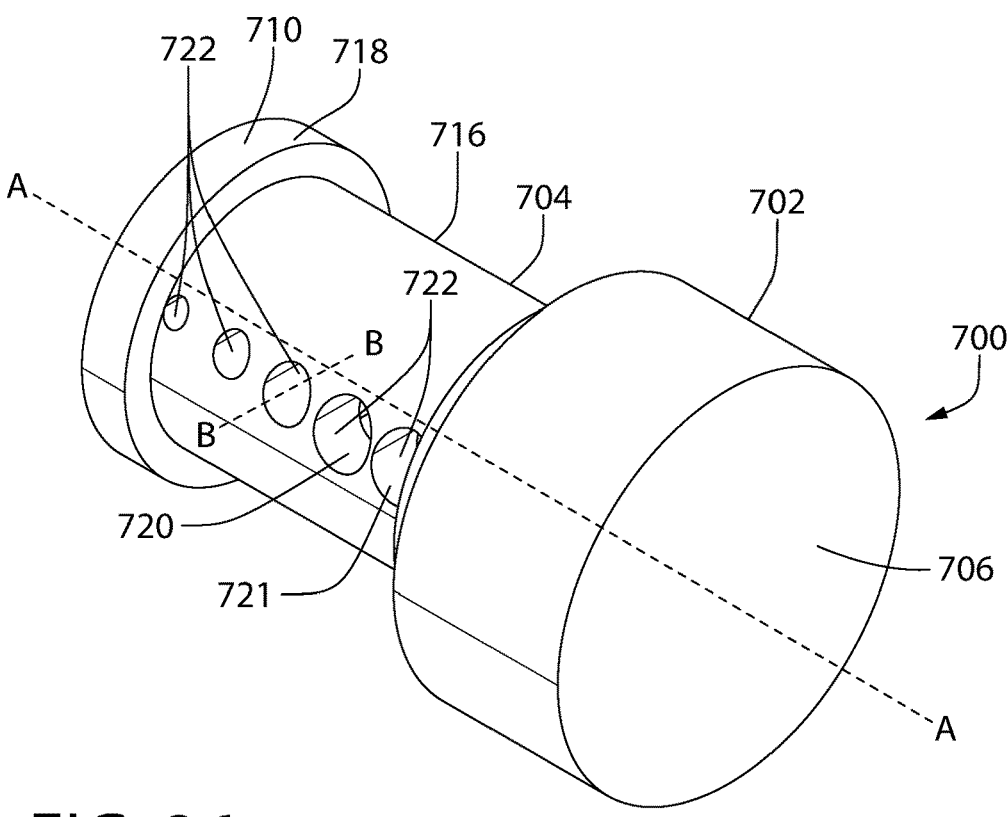
FIG. 26 is a perspective view of another embodiment of a mixing element as may be utilized in the flow component of FIG. 3.
Figure 27:
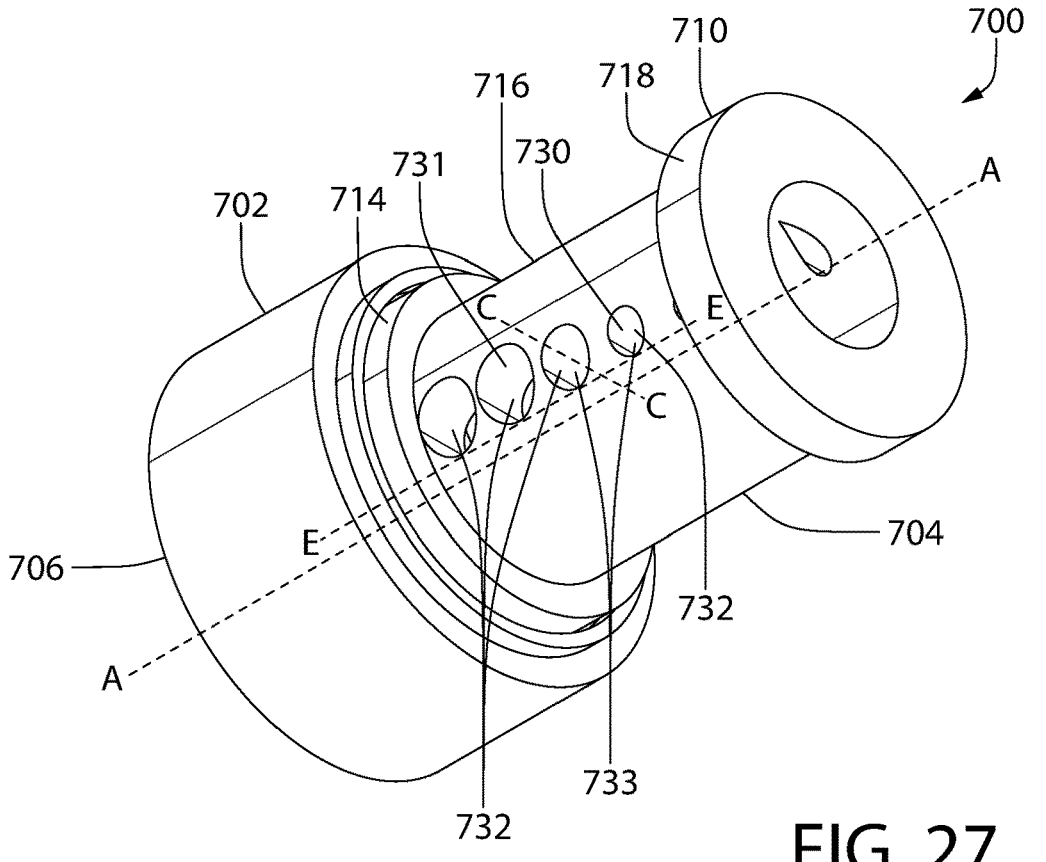
FIG. 27 is a rear perspective view of the mixing element of FIG. 26.
Figure 28:
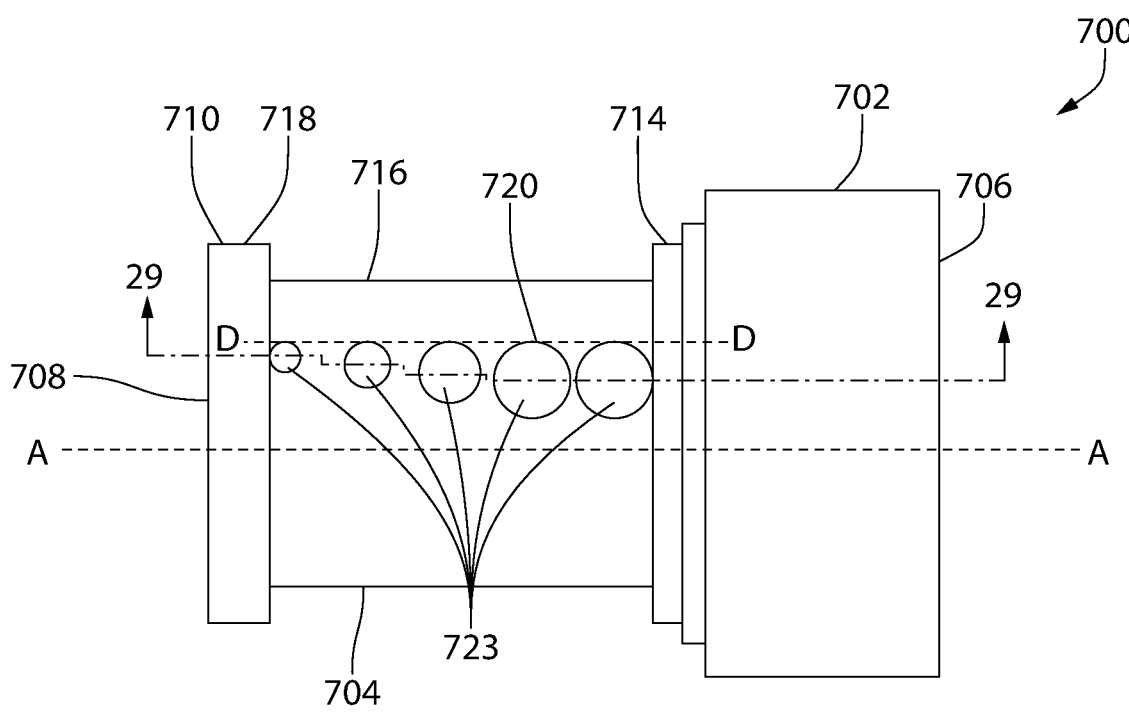
FIG. 28 is a left side view of the mixing element of FIG. 26.
Figure 29:
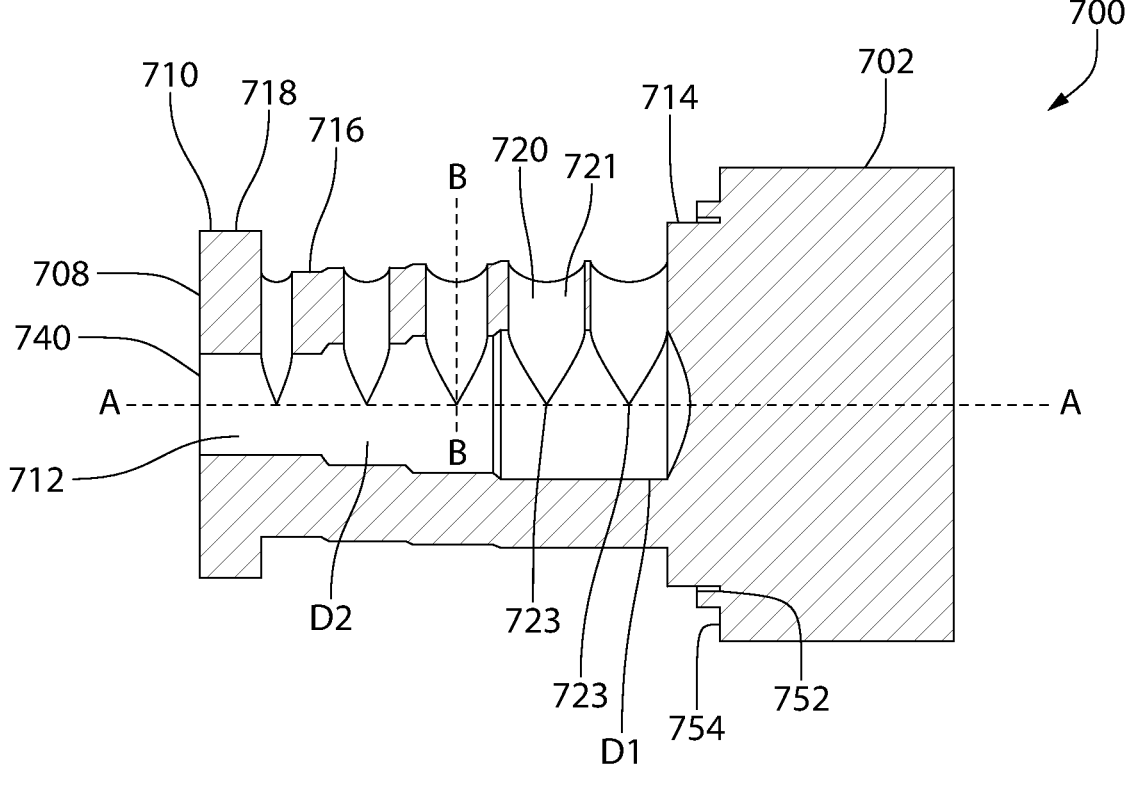
FIG. 29 is a cross-sectional view of the mixing element, taken along line 29-29 of FIG. 28.
Figures 30, 31:
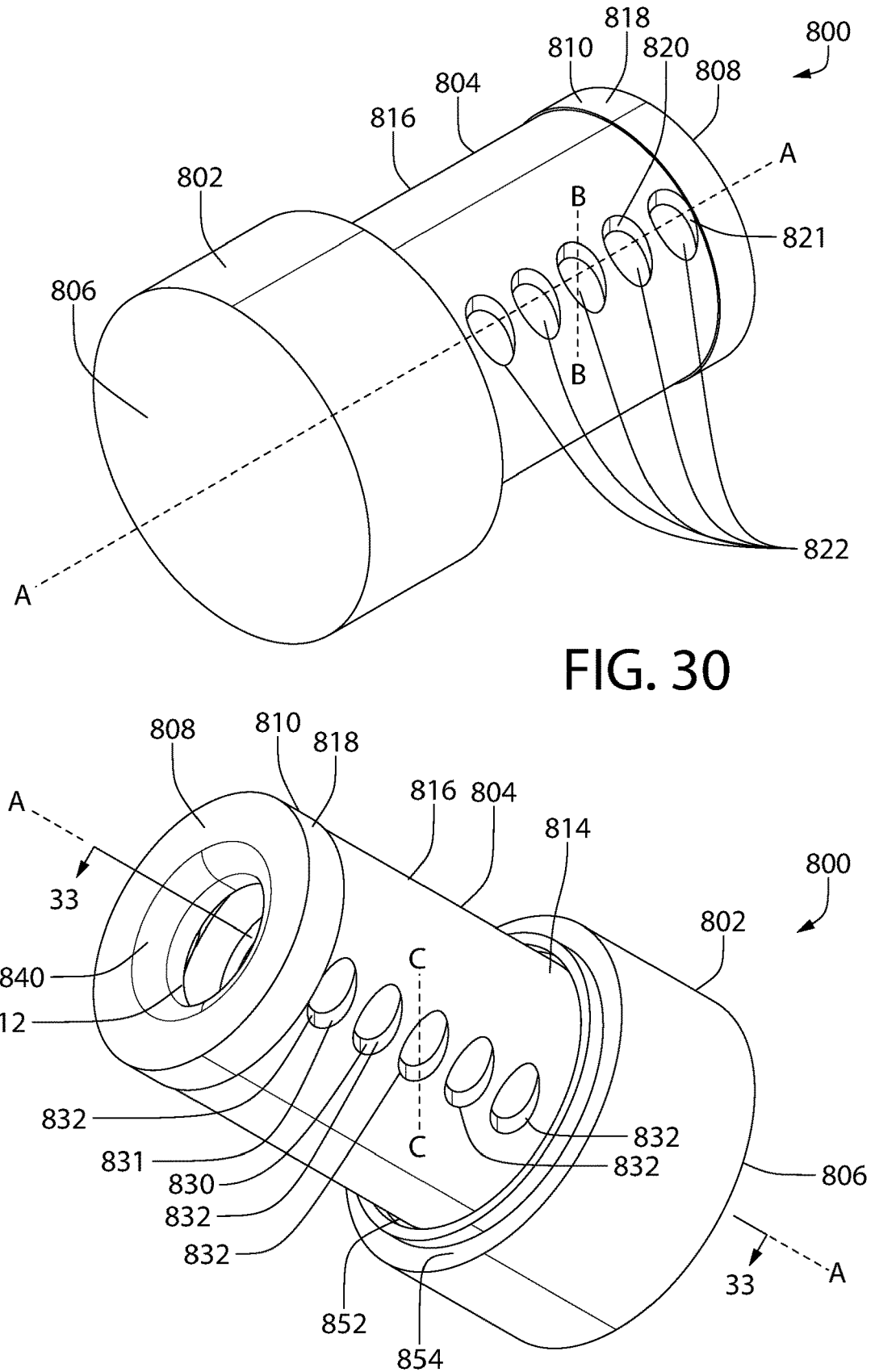
FIG. 30 is a perspective view of another embodiment of a mixing element as may be utilized in the flow component of FIG. 3.
FIG. 31 is a rear perspective view of the mixing element of FIG. 30.
Figure 32:
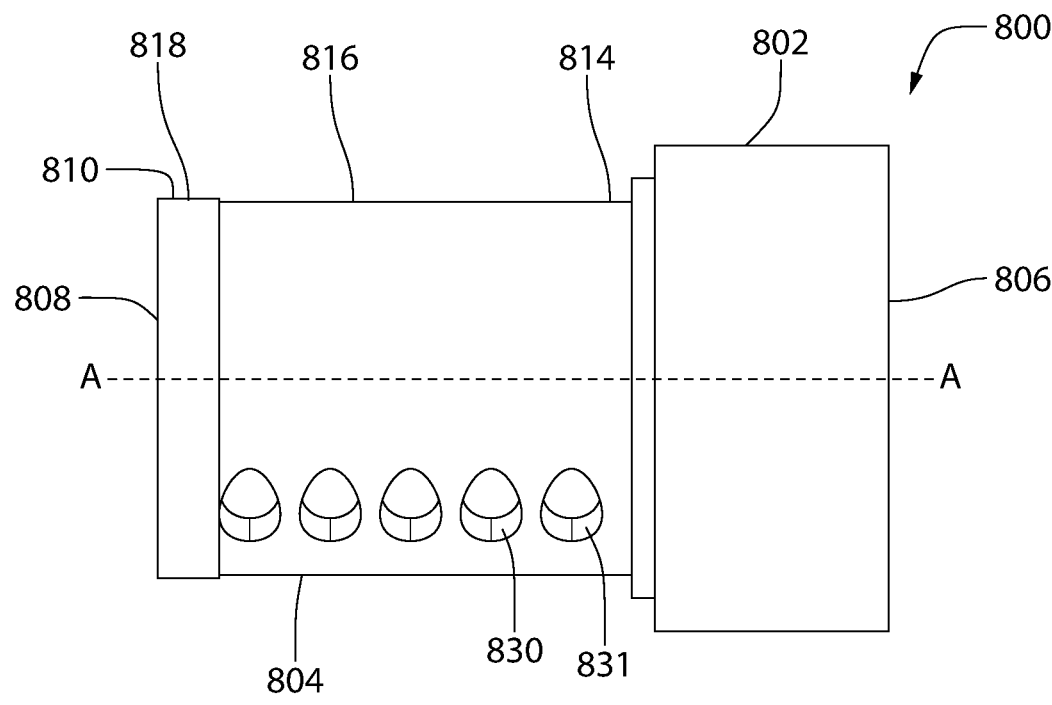
FIG. 32 is a left side view of the mixing element of FIG. 30.
Figure 33:
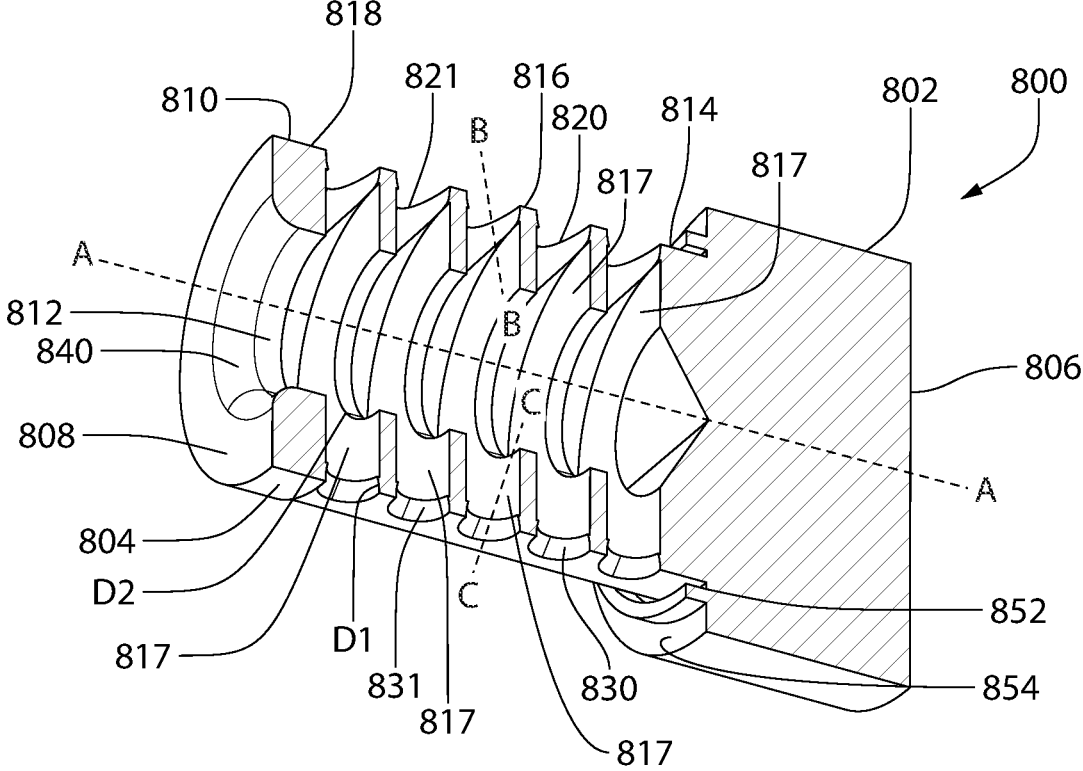
FIG. 33 is a cross-sectional view of the mixing element, taken along line 33-33 of FIG. 31.

Turning to FIGS. 3-5, a fluid flow component 130 is illustrated. In the present embodiment, the fluid flow component 130 is a fluid mixer intended to mix two or more fluids and output a fluid mixture. As shown, the fluid flow component 130 is a passive component, but in other configurations it may be configured as an active component capable of actively altering fluid flow. The component 130 has a component body 132, the component body 132 having a top surface 133, bottom surface 134, front surface 135, rear surface 136, left surface 137, and right surface 138. As can be seen, the rear surface 136 is not planar, but instead comprises a projection which extends from adjacent portions of the rear surface 136.

The top surface 133 of the component body 132 comprises a first port 141, a second port 142, and a third port 143. The first and second ports 141, 142 are configured to receive fluid while the third port 143 is configured to output fluid. However, in some embodiments, different ones of the first, second, and third ports 141, 142, 143 may serve as inlets and outlets. In addition, it is conceived that there may be more than three ports to facilitate combining more than two fluids or splitting one or more fluids. Each of the ports 141, 142, 143 comprises a seal cavity which is configured to receive a seal to facilitate connection with other components. The component body 132 further comprises a plurality of fastener passageways 145 that facilitate attachment of the component body 132 to the support structure 1402. In addition, the fastener passageways 145 can facilitate attachment of other flow components 110, 120 to the component body 132. The fastener passageways 145 may be through holes, threaded holes, or may be formed in any manner that permits attachment.

The bottom surface 134 of the component body 132 is configured to be in physical contact with the top surface 1403 of the support structure 1402 when the fluid flow component 130 is mounted to the support structure 1402. However, in other embodiments, the top surface 1403 may face the top surface 133 if the fluid flow component 130 is attached to another fluid flow component 110, 120, this fluid flow component 110, 120 being directly coupled to the support structure 1402.

The front surface 135 and the left surface 137 collectively comprise a plurality of assembly ports 147. Each of the assembly ports 147 comprises a retention component 148 which provides a fluid-tight seal for the assembly ports 147 and retains any components installed in the assembly ports 147. For example, FIG. 4 illustrates an exploded view of the retention component 148 removed from the component body 132. A mixing element 200 is also shown, which is retained by the retention component 148.

FIG. 5 illustrates a cross-section of the fluid flow component 130 in the assembled condition. The fluid flow component 130 has first, second, and third flow paths 151, 152, 153 extending from the first, second, and third ports 141, 142, 143 to a junction 155. The mixing element 200 is located at the junction 155. Thus, fluid can flow from the first port 141 through the first flow path 151 to the junction 155. Fluid can also flow from the second port 142 through the second flow path 152 to the junction 155. Fluid can flow from the junction 155 through the third flow path 153 to the third port 143. The first, second, and third flow paths 151, 152, 153 meet to form a T shape at the junction 155.

More specifically, the first flow path 151 has a first conduit 156, the first conduit 156 being immediately adjacent the junction 155. The second flow path 152 has a second conduit 157, the second conduit 157 being immediately adjacent the junction 155. The third flow path 153 has a third conduit 158, the third conduit 158 being immediately adjacent the junction 155. The first and second conduits 156, 157 of the first and second flow paths 151, 152 are co-linear while the third conduit 158 of the third flow path 153 is perpendicular to the first and second conduits 156, 157 of the first and second flow paths 151, 152. Thus, fluid flows along the first and second flow paths 151, 152 and meets at the junction 155. Fluid then proceeds from the junction 155 via the third conduit 158 of the third flow path 153 at a right angle from both of the first and second conduits 156, 157 of the first and second flow paths 151, 152.

Check valves 157 are located in the first and second flow paths 151, 152 to prevent back-flow of the fluids supplied to the first and second ports 141, 142. However, the check valves 157 may be omitted or different components may be used in place of the check valves 157 depending on the specific application for the fluid flow component 130. Each of the check valves 157 is installed via an assembly port 147 and retained by a retention component 148. The retention components 148 may be threaded and the assembly port 147 may have corresponding threads to allow retaining of the check valves 157 and the mixing element 200. Alternatively, other known retention means may be utilized as desired.

The assembly port 147 located on the left side 137 of the component body 132 does not have a component inserted therein, but instead includes a seal 159 to prevent leakage. The seal 159 serves no other purpose than to seal the assembly port 147. However, it is possible to utilize one or more assembly ports 147 to enable additional fluid connections. As can be seen, each of the mixing element 200, check valves 157, and seal 159 engage an annular rib 149 within the assembly ports 147. This annular rib 149 ensures that sealing is achieved and provides an axial constraint for the mixing element 200, check valves 157, and seal 159. Thus, the annular rib 149 and a corresponding annular groove 150 ensure that the components will be properly retained within the assembly port 147 and will seal to prevent fluid leakage.

Turning to FIGS. 6-9, the mixing element 200 is illustrated in greater detail. The mixing element 200 has a flange 202 and a tubular body 204. The tubular body 204 extends along a longitudinal axis A-A from a closed end 206 to an open end 208. The tubular body 204 further comprises an outer surface 210 and an inner surface 212. Each of the outer surface 210 and the inner surface 212 extend from the closed end 206 to the open end 208. The inner surface 212 has a constant diameter along the longitudinal axis A-A. In some embodiments, the inner surface 212 may vary in diameter. The outer surface 210 of the tubular body 204 has a first sealing surface 214 proximate the closed end 206 and a second sealing surface 218 proximate the open end 208. The first and second sealing surfaces 214, 218 may have different diameters or may have the same diameter.

A groove surface 216 extends between the first and second sealing surfaces 214, 218. The groove surface 216 may have a diameter that is smaller than the diameters of the first and second sealing surfaces 214, 218. The groove surface 216 need not have a constant diameter, and may have variations in the diameter with respect to the longitudinal axis. In some embodiments, the groove surface 216 may have portions which are the same diameter as one of the first or second sealing surfaces 214, 218. In yet other embodiments, the groove surface 216 may be omitted entirely.

The mixing element 200 comprises a first fluid inlet 220, a second fluid inlet 230, and a fluid outlet 240. The first and second fluid inlets 220, 230 are formed through the tubular body 204 from the outer surface 210 to the inner surface 212. More specifically, the first and second fluid inlets 220, 230 are formed in the groove surface 216 of the outer surface 210. The fluid outlet 240 is formed by the open end 208. Thus, fluid flows through the first and second fluid inlets 220, 230, along the inside of the tubular body 204, and out of the fluid outlet 240.

The first and second fluid inlets 220, 230 are formed as slots which extend along first and second inlet axes B-B, C-C. The slots are elongate in a direction parallel to the longitudinal axis A-A and have a greater length in the direction parallel to the longitudinal axis A-A than they have a height perpendicular to the longitudinal axis A-A. The slots are formed such that they have first and second inlet surfaces 221, 231. The first and second inlet surfaces 221, 231 have a constant profile extending through the tubular body 204 along the first and second inlet axes B-B, C-C. Thus, the profiles of the first and second inlet surfaces 221, 231 is constant as they extends along the first and second inlet axes B-B, C-C. The first and second fluid inlets 220, 230 have an identical profile. In other embodiments, the profiles of the first and second fluid inlets 220, 230 may not be identical. Instead, the first and second fluid inlets 220, 230 may have different profiles to optimize mixing for factors such as different flow rates for the different fluids or other factors.

The first and second inlet axes B-B, C-C are spaced from the longitudinal axis A-A so that they do not intersect the longitudinal axis A-A. The first and second inlet axes B-B, C-C are parallel to one another and perpendicular to the longitudinal axis A-A. However, the first and second inlet axes B-B, C-C are located on opposite sides of the longitudinal axis A-A. Thus, the first and second inlet axes B-B, C-C are perpendicular but non-intersecting the longitudinal axis A-A. In other embodiments, the first and second inlet axes B-B, C-C are not parallel with each other. In yet other embodiments, the first and second inlet axes B-B, C-C may not be perpendicular to the longitudinal axis A-A. In these embodiments, the first and second inlet axes B-B, C-C may be perpendicular to the longitudinal axis A-A and non-parallel with each other. In these embodiments, it is also possible that the first and second inlet axes B-B, C-C may not be perpendicular to the longitudinal axis A-A but may be parallel to one another.

The first and second fluid inlets 220, 230 have first and second inlet surfaces 221, 231 as discussed above. In this embodiment, the first and second fluid inlets 220, 230 are identical and rotationally symmetric about the longitudinal axis A-A. The first and second fluid inlets 220, 230 extend less than half of the length of the groove surface 216 along the longitudinal axis A-A and have a height which is less than a width along the longitudinal axis. As can be seen best in FIG. 9, a top surface 222 of the first inlet surface 221 joins the inner surface 212. More specifically, the top surface 222 of the first inlet surface 221 meets the inner surface 212 at a point of tangency 223. The top surface 222 of the first inlet surface 221 is tangent to the inner surface 212, with the two surfaces meeting at the point of tangency 223. Said differently, there are no discontinuities between the top surface 222 of the first inlet surface 221 and the inner surface 212 as the top surface 222 joins the inner surface 212.

The second inlet surface 231 also has a top surface 232 which joins the inner surface 212 tangentially, with a corresponding point of tangency. The first inlet surface 221 also has a bottom surface 224, an open end surface 225, and a closed end surface 226. Similarly, the second inlet surface 231 has the top surface 232, a bottom surface 234, an open end surface 235, and a closed end surface 236. The flange 202 of the mixing element 200 further comprises a flange groove 252 and a flange surface 254. The flange groove 252 is formed into the flange surface 254 to permit assembly of the mixing element 200 with an assembly port 147 and provide effective sealing of the assembly port 147. More specifically, the flange groove 252 is configured to receive the annular rib 149 within each of the assembly ports 147.

Turning to FIGS. 10-13, another embodiment of a mixing element 300 is described herein. The mixing element 300 is similar to the mixing element 200 with the exception of features noted below. The mixing element 300 has a flange 302 and a tubular body 304. The tubular body 304 extends along a longitudinal axis A-A from a closed end 306 to an open end 308. The tubular body 304 further comprises an outer surface 310 and an inner surface 312. Each of the outer surface 310 and the inner surface 312 extend from the closed end 306 to the open end 308. The inner surface 312 has a constant diameter along the longitudinal axis A-A. In some embodiments, the inner surface 312 may vary in diameter. The outer surface 310 of the tubular body 304 has a first sealing surface 314 proximate the closed end 306 and a second sealing surface 318 proximate the open end 308. The first and second sealing surfaces 314, 318 may have different diameters or may have the same diameter.

A groove surface 316 extends between the first and second sealing surfaces 314, 318. The groove surface 316 may have a diameter that is smaller than the diameters of the first and second sealing surfaces 314, 318. The groove surface 316 need not have a constant diameter, and may have variations in the diameter with respect to the longitudinal axis. In some embodiments, the groove surface 316 may have portions which are the same diameter as one of the first or second sealing surfaces 314, 318. In yet other embodiments, the groove surface 316 may be omitted entirely.

The mixing element 300 comprises a first fluid inlet 320, a second fluid inlet 330, and a fluid outlet 340. The first and second fluid inlets 320, 330 are formed through the tubular body 304 from the outer surface 310 to the inner surface 312. More specifically, the first and second fluid inlets 320, 330 are formed in the groove surface 316 of the outer surface 310. The fluid outlet 340 is formed by the open end 308. Thus, fluid flows through the first and second fluid inlets 320, 330, along the inside of the tubular body 304, and out of the fluid outlet 340.

The first and second fluid inlets 320, 330 are formed as slots which extend along first and second inlet axes B-B, C-C. The slots are elongate in a direction parallel to the longitudinal axis A-A and have a greater length in the direction parallel to the longitudinal axis A-A than they have a height perpendicular to the longitudinal axis A-A. The slots are formed such that they have first and second inlet surfaces 321, 331. The first and second inlet surfaces 321, 331 have a constant profile extending through the tubular body 304 along the first and second inlet axes B-B, C-C. Thus, the profiles of the first and second inlet surfaces 321, 331 is constant as they extends along the first and second inlet axes B-B, C-C. The first and second fluid inlets 320, 330 have an identical profile. In other embodiments, the profiles of the first and second fluid inlets 320, 330 may not be identical. Instead, the first and second fluid inlets 320, 330 may have different profiles to optimize mixing for factors such as different flow rates for the different fluids or other factors.

The first and second inlet axes B-B, C-C are spaced from the longitudinal axis A-A so that they do not intersect the longitudinal axis A-A. The first and second inlet axes B-B, C-C are parallel to one another and perpendicular to the longitudinal axis A-A. However, the first and second inlet axes B-B, C-C are located on opposite sides of the longitudinal axis A-A. Thus, the first and second inlet axes B-B, C-C are perpendicular but non-intersecting the longitudinal axis A-A. In other embodiments, the first and second inlet axes B-B, C-C are not parallel with each other. In yet other embodiments, the first and second inlet axes B-B, C-C may not be perpendicular to the longitudinal axis A-A. In these embodiments, the first and second inlet axes B-B, C-C may be perpendicular to the longitudinal axis A-A and non-parallel with each other. In these embodiments, it is also possible that the first and second inlet axes B-B, C-C may not be perpendicular to the longitudinal axis A-A but may be parallel to one another.

The first and second fluid inlets 320, 330 have first and second inlet surfaces 321, 331 as discussed above. In this embodiment, the first and second fluid inlets 320, 330 are identical and rotationally symmetric about the longitudinal axis A-A. The first and second fluid inlets 320, 330 extend greater than half of the length of the groove surface 316 along the longitudinal axis A-A and have a height which is less than a width along the longitudinal axis. A top surface 322 of the first inlet surface 321 joins the inner surface 312. More specifically, the top surface 322 of the first inlet surface 321 meets the inner surface 312 at a point of tangency 323. The top surface 322 of the first inlet surface 321 is tangent to the inner surface 312, with the two surfaces meeting at the point of tangency 323. Said differently, there are no discontinuities between the top surface 322 of the first inlet surface 321 and the inner surface 312 as the top surface 322 joins the inner surface 312.

The second inlet surface 331 also has a top surface 332 which joins the inner surface 312 tangentially, with a corresponding point of tangency. The first inlet surface 321 also has a bottom surface 324, an open end surface 325, and a closed end surface 326. Similarly, the second inlet surface 331 has the top surface 332, a bottom surface 334, an open end surface 335, and a closed end surface 336. The flange 302 of the mixing element 300 further comprises a flange groove 352 and a flange surface 354. The flange groove 352 is formed into the flange surface 354 to permit assembly of the mixing element 300 with an assembly port 147 and provide effective sealing of the assembly port 147. More specifically, the flange groove 352 is configured to receive the annular rib 149 within each of the assembly ports 147.

Turning to FIGS. 14-17, another embodiment of a mixing element 400 is described herein. The mixing element 400 is similar to the mixing element 200 with the exception of features noted below. The mixing element 400 has a flange 402 and a tubular body 404. The tubular body 404 extends along a longitudinal axis A-A from a closed end 406 to an open end 408. The tubular body 404 further comprises an outer surface 410 and an inner surface 412. Each of the outer surface 410 and the inner surface 412 extend from the closed end 406 to the open end 408. The inner surface 412 has a constant diameter along the longitudinal axis A-A. In some embodiments, the inner surface 412 may vary in diameter. The outer surface 410 of the tubular body 404 has a first sealing surface 414 proximate the closed end 406 and a second sealing surface 418 proximate the open end 408. The first and second sealing surfaces 414, 418 may have different diameters or may have the same diameter.

A groove surface 416 extends between the first and second sealing surfaces 414, 418. The groove surface 416 may have a diameter that is smaller than the diameters of the first and second sealing surfaces 414, 418. The groove surface 416 need not have a constant diameter, and may have variations in the diameter with respect to the longitudinal axis. In some embodiments, the groove surface 416 may have portions which are the same diameter as one of the first or second sealing surfaces 414, 418. In yet other embodiments, the groove surface 416 may be omitted entirely.

The mixing element 400 comprises a first fluid inlet 420, a second fluid inlet 430, and a fluid outlet 440. The first and second fluid inlets 420, 430 are formed through the tubular body 404 from the outer surface 410 to the inner surface 412. More specifically, the first and second fluid inlets 420, 430 are formed in the groove surface 416 of the outer surface 410. The fluid outlet 440 is formed by the open end 408. Thus, fluid flows through the first and second fluid inlets 420, 430, along the inside of the tubular body 404, and out of the fluid outlet 440.

The first and second fluid inlets 420, 430 are formed as slots which extend along first and second inlet axes B-B, C-C. The slots are elongate in a direction parallel to the longitudinal axis A-A and have a greater length in the direction parallel to the longitudinal axis A-A than they have a height perpendicular to the longitudinal axis A-A. The slots are formed such that they have first and second inlet surfaces 421, 431. The first and second inlet surfaces 421, 431 have a constant profile extending through the tubular body 404 along the first and second inlet axes B-B, C-C. Thus, the profiles of the first and second inlet surfaces 421, 431 is constant as they extends along the first and second inlet axes B-B, C-C. The first and second fluid inlets 420, 430 have an identical profile. In other embodiments, the profiles of the first and second fluid inlets 420, 430 may not be identical. Instead, the first and second fluid inlets 420, 430 may have different profiles to optimize mixing for factors such as different flow rates for the different fluids or other factors.

The first and second inlet axes B-B, C-C are spaced from the longitudinal axis A-A so that they do not intersect the longitudinal axis A-A. The first and second inlet axes B-B, C-C are parallel to one another and perpendicular to the longitudinal axis A-A. However, the first and second inlet axes B-B, C-C are located on opposite sides of the longitudinal axis A-A. Thus, the first and second inlet axes B-B, C-C are perpendicular but non-intersecting the longitudinal axis A-A. In other embodiments, the first and second inlet axes B-B, C-C are not parallel with each other. In yet other embodiments, the first and second inlet axes B-B, C-C may not be perpendicular to the longitudinal axis A-A. In these embodiments, the first and second inlet axes B-B, C-C may be perpendicular to the longitudinal axis A-A and non-parallel with each other. In these embodiments, it is also possible that the first and second inlet axes B-B, C-C may not be perpendicular to the longitudinal axis A-A but may be parallel to one another.

The first and second fluid inlets 420, 430 have first and second inlet surfaces 421, 431 as discussed above. In this embodiment, the first and second fluid inlets 420, 430 are identical and rotationally symmetric about the longitudinal axis A-A. The first and second fluid inlets 420, 430 extend an entirety of the length of the groove surface 416 along the longitudinal axis A-A and have a height which is less than a width along the longitudinal axis. A top surface 422 of the first inlet surface 421 joins the inner surface 412. More specifically, the top surface 422 of the first inlet surface 421 meets the inner surface 412 at a point of tangency 423. The top surface 422 of the first inlet surface 421 is tangent to the inner surface 412, with the two surfaces meeting at the point of tangency 423. Said differently, there are no discontinuities between the top surface 422 of the first inlet surface 421 and the inner surface 412 as the top surface 422 joins the inner surface 412.

The second inlet surface 431 also has a top surface 432 which joins the inner surface 412 tangentially, with a corresponding point of tangency. The first inlet surface 421 also has a bottom surface 424, an open end surface 425, and a closed end surface 426. Similarly, the second inlet surface 431 has the top surface 432, a bottom surface 434, an open end surface 435, and a closed end surface 436. The flange 402 of the mixing element 400 further comprises a flange groove 452 and a flange surface 454. The flange groove 452 is formed into the flange surface 454 to permit assembly of the mixing element 400 with an assembly port 147 and provide effective sealing of the assembly port 147. More specifically, the flange groove 452 is configured to receive the annular rib 149 within each of the assembly ports 147.

Turning to FIGS. 18-21, another embodiment of a mixing element 500 is described herein. The mixing element 500 is similar to the mixing element 200 with the exception of features noted below. The mixing element 500 has a flange 502 and a tubular body 504. The tubular body 504 extends along a longitudinal axis A-A from a closed end 506 to an open end 508. The tubular body 504 further comprises an outer surface 510 and an inner surface 512. Each of the outer surface 510 and the inner surface 512 extend from the closed end 506 to the open end 508. The inner surface 512 has a constant diameter along the longitudinal axis A-A. In some embodiments, the inner surface 512 may vary in diameter. The outer surface 510 of the tubular body 504 has a first sealing surface 514 proximate the closed end 506 and a second sealing surface 518 proximate the open end 508. The first and second sealing surfaces 514, 518 may have different diameters or may have the same diameter.

A groove surface 516 extends between the first and second sealing surfaces 514, 518. The groove surface 516 may have a diameter that is smaller than the diameters of the first and second sealing surfaces 514, 518. The groove surface 516 need not have a constant diameter, and may have variations in the diameter with respect to the longitudinal axis. In some embodiments, the groove surface 516 may have portions which are the same diameter as one of the first or second sealing surfaces 514, 518. In yet other embodiments, the groove surface 516 may be omitted entirely.

The mixing element 500 comprises a first fluid inlet 520, a second fluid inlet 530, and a fluid outlet 540. The first and second fluid inlets 520, 530 are formed through the tubular body 504 from the outer surface 510 to the inner surface 512. More specifically, the first and second fluid inlets 520, 530 are formed in the groove surface 516 of the outer surface 510. The fluid outlet 540 is formed by the open end 508. Thus, fluid flows through the first and second fluid inlets 520, 530, along the inside of the tubular body 504, and out of the fluid outlet 540.

The first and second fluid inlets 520, 530 are each formed as a row of holes 522, 532 which extend along first and second inlet axes B-B, C-C. The rows of holes 522, 532 are arranged in a row in a direction parallel to the longitudinal axis A-A. Each of the holes 522 of the first fluid inlet 520 have different diameters and are offset from one another in a circumferential direction such that a circumference 523 of each of the holes 522 is tangential to an axis D-D, the axis D-D parallel to the longitudinal axis A-A. Each of the holes 532 of the second fluid inlet 530 have different diameters and are offset from one another in a circumferential direction such that a circumference 533 of each of the holes 532 is tangential to an axis E-E.

The holes 522, 532 have first and second inlet surfaces 521, 531 extending from the inner surface 512 to the outer surface 510 of the tubular body 504. The first and second inlet surfaces 521, 531 have a constant profile extending through the tubular body 504 along the first and second inlet axes B-B, C-C. Thus, the profiles of the first and second inlet surfaces 521, 531 are constant as they extend along the first and second inlet axes B-B, C-C. The first and second fluid inlets 520, 530 have an identical profile, including the diameters and arrangement of the holes 522, 532. In other embodiments, the profiles of the first and second fluid inlets 520, 530 may not be identical. Instead, the first and second fluid inlets 520, 530 may have different profiles to optimize mixing for factors such as different flow rates for the different fluids or other factors.

The first and second inlet axes B-B, C-C are spaced from the longitudinal axis A-A so that they do not intersect the longitudinal axis A-A. The first and second inlet axes B-B, C-C are parallel to one another and perpendicular to the longitudinal axis A-A. However, the first and second inlet axes B-B, C-C are located on opposite sides of the longitudinal axis A-A. Thus, the first and second inlet axes B-B, C-C are perpendicular but non-intersecting the longitudinal axis A-A. In other embodiments, the first and second inlet axes B-B, C-C are not parallel with each other. In yet other embodiments, the first and second inlet axes B-B, C-C may not be perpendicular to the longitudinal axis A-A. In these embodiments, the first and second inlet axes B-B, C-C may be perpendicular to the longitudinal axis A-A and non-parallel with each other. In these embodiments, it is also possible that the first and second inlet axes B-B, C-C may not be perpendicular to the longitudinal axis A-A but may be parallel to one another.

The first and second fluid inlets 520, 530 have first and second inlet surfaces 521, 531 as discussed above. In this embodiment, the first and second fluid inlets 520, 530 are identical and rotationally symmetric about the longitudinal axis A-A. The first and second fluid inlets 520, 530 extend a majority of the length of the groove surface 516 along the longitudinal axis A-A. A portion of the first inlet surface 521 of each of the holes 522 joins the inner surface 512. More specifically, the portion of the first inlet surface 521 meets the inner surface 512 at a point of tangency 523. Thus, the portion of the first inlet surface 521 is tangent to the inner surface 512, with the two surfaces meeting at the point of tangency 523. Said differently, there are no discontinuities between the portion of the first inlet surface 521 and the inner surface 512 as the portion joins the inner surface 512.

The second inlet surface 531 also has a portion which joins the inner surface 512 tangentially, with a corresponding point of tangency. The flange 502 of the mixing element 500 further comprises a flange groove 552 and a flange surface 554. The flange groove 552 is formed into the flange surface 554 to permit assembly of the mixing element 500 with an assembly port 147 and provide effective sealing of the assembly port 147. More specifically, the flange groove 552 is configured to receive the annular rib 149 within each of the assembly ports 147.

Turning to FIGS. 22-25, another embodiment of a mixing element 600 is described herein. The mixing element 600 is similar to the mixing element 200 with the exception of features noted below. The mixing element 600 has a flange 602 and a tubular body 604. The tubular body 604 extends along a longitudinal axis A-A from a closed end 606 to an open end 608. The tubular body 604 further comprises an outer surface 610 and an inner surface 612. Each of the outer surface 610 and the inner surface 612 extend from the closed end 606 to the open end 608. The inner surface 612 has a constant diameter along the longitudinal axis A-A. In some embodiments, the inner surface 612 may vary in diameter. The outer surface 610 of the tubular body 604 has a first sealing surface 614 proximate the closed end 606 and a second sealing surface 618 proximate the open end 608. The first and second sealing surfaces 614, 618 may have different diameters or may have the same diameter.

A groove surface 616 extends between the first and second sealing surfaces 614, 618. The groove surface 616 may have a diameter that is smaller than the diameters of the first and second sealing surfaces 614, 618. The groove surface 616 need not have a constant diameter, and may have variations in the diameter with respect to the longitudinal axis. In the present embodiment, the groove surface 616 comprises a plurality of grooves 617 arranged along the groove surface 616 between the first and second sealing surfaces 614, 618. As can be seen, the grooves 617 have a semi-circular shape and the space between the grooves 617 is a constant diameter. The space between grooves 617 is the same diameter as the first sealing surface 614, but may be any desired diameter.

The mixing element 600 comprises a first fluid inlet 620, a second fluid inlet 630, and a fluid outlet 640. The first and second fluid inlets 620, 630 are formed through the tubular body 604 from the outer surface 610 to the inner surface 612. More specifically, the first and second fluid inlets 620, 630 are formed as a plurality of holes located in the grooves 617 of the groove surface 616. The fluid outlet 640 is formed by the open end 608. Thus, fluid flows through the first and second fluid inlets 620, 630, along the inside of the tubular body 604, and out of the fluid outlet 640.

The first and second fluid inlets 620, 630 are each formed as a plurality of rows of holes 622, 632. One of the rows of holes 622 of the first fluid inlet 620 extend along a first inlet axis B-B, while other rows of holes 622 of the first fluid inlet 620 extend along axes which are rotationally symmetric with the first inlet axis B-B. Similarly, one of the rows of holes 632 of the second fluid inlet 630 extend along a second inlet axis C-C, while other rows of holes 632 of the second fluid inlet 630 extend along axes which are rotationally symmetric with the second inlet axis C-C. The rows of holes 622, 632 are arranged in rows in a direction parallel to the longitudinal axis A-A. Each of the holes 622, 632 of the first and second fluid inlets 620, 630 have equal diameters. In other embodiments, the holes 622, 632 may be different diameters or the rows may be unequally spaced about the longitudinal axis A-A. In yet other embodiments, the holes 622 of the first fluid inlet 620 may be different than the holes 632 of the second fluid inlet 630.

The holes 622, 632 have first and second inlet surfaces 621, 631 extending from the inner surface 612 to the outer surface 610 of the tubular body 604. The first and second inlet surfaces 621, 631 have a constant profile extending through the tubular body 604 from the outer surface 610 to the inner surface 612. Thus, the profiles of the first and second inlet surfaces 621, 631 are constant as they extend through the tubular body 604. The first and second fluid inlets 620, 630 have an identical profile, including the diameters and arrangement of the holes 622, 632. In other embodiments, the profiles of the first and second fluid inlets 620, 630 may not be identical. Instead, the first and second fluid inlets 620, 630 may have different profiles to optimize mixing for factors such as different flow rates for the different fluids or other factors. In yet other embodiments, the holes 622, 632 may not be arranged in the grooves 617, but may overlap the grooves 617. The holes 622, 632 are equally spaced along the longitudinal axis A-A, but in other embodiments they may be unequally spaced.

The first and second inlet axes B-B, C-C are spaced from the longitudinal axis A-A so that they do not intersect the longitudinal axis A-A. The first and second inlet axes B-B, C-C are parallel to one another and perpendicular to the longitudinal axis A-A. However, the first and second inlet axes B-B, C-C are located on opposite sides of the longitudinal axis A-A. Thus, the first and second inlet axes B-B, C-C are perpendicular but non-intersecting the longitudinal axis A-A. In other embodiments, the first and second inlet axes B-B, C-C are not parallel with each other. In yet other embodiments, the first and second inlet axes B-B, C-C may not be perpendicular to the longitudinal axis A-A. In these embodiments, the first and second inlet axes B-B, C-C may be perpendicular to the longitudinal axis A-A and non-parallel with each other. In these embodiments, it is also possible that the first and second inlet axes B-B, C-C may not be perpendicular to the longitudinal axis A-A but may be parallel to one another.

The first and second fluid inlets 620, 630 have first and second inlet surfaces 621, 631 as discussed above. In this embodiment, the first and second fluid inlets 620, 630 are identical and rotationally symmetric about the longitudinal axis A-A. The first and second fluid inlets 620, 630 extend across a substantial entirety of the length of the groove surface 616 along the longitudinal axis A-A. The flange 602 of the mixing element 600 further comprises a flange groove 652 and a flange surface 654. The flange groove 652 is formed into the flange surface 654 to permit assembly of the mixing element 600 with an assembly port 147 and provide effective sealing of the assembly port 147. More specifically, the flange groove 652 is configured to receive the annular rib 149 within each of the assembly ports 147.

Turning to FIGS. 26-29, another embodiment of a mixing element 700 is described herein. The mixing element 700 is similar to the mixing element 200 with the exception of features noted below. The mixing element 700 has a flange 702 and a tubular body 704. The tubular body 704 extends along a longitudinal axis A-A from a closed end 706 to an open end 708. The tubular body 704 further comprises an outer surface 710 and an inner surface 712. Each of the outer surface 710 and the inner surface 712 extend from the closed end 706 to the open end 708. The inner surface 712 has a non-constant diameter along the longitudinal axis A-A. In other words, the inner surface 712 varies in diameter. The inner surface 712 has a first diameter D1 and a second diameter D2, the first diameter D1 being greater than the second diameter D2. In other embodiments, the inner surface 712 may have more than two different diameters, may vary continuously in at least a portion, or may have any other internal shape as desired. The outer surface 710 of the tubular body 704 has a first sealing surface 714 proximate the closed end 706 and a second sealing surface 718 proximate the open end 708. The first and second sealing surfaces 714, 718 may have different diameters or may have the same diameter.

A groove surface 716 extends between the first and second sealing surfaces 714, 718. The groove surface 716 may have a diameter that is smaller than the diameters of the first and second sealing surfaces 714, 718. The groove surface 716 need not have a constant diameter, and may have variations in the diameter with respect to the longitudinal axis. In some embodiments, the groove surface 716 may have portions which are the same diameter as one of the first or second sealing surfaces 714, 718. In yet other embodiments, the groove surface 716 may be omitted entirely.

The mixing element 700 comprises a first fluid inlet 720, a second fluid inlet 730, and a fluid outlet 740. The first and second fluid inlets 720, 730 are formed through the tubular body 704 from the outer surface 710 to the inner surface 712. More specifically, the first and second fluid inlets 720, 730 are formed in the groove surface 716 of the outer surface 710. The fluid outlet 740 is formed by the open end 708. Thus, fluid flows through the first and second fluid inlets 720, 730, along the inside of the tubular body 704, and out of the fluid outlet 740.

The first and second fluid inlets 720, 730 are each formed as a row of holes 722, 732 which extend along first and second inlet axes B-B, C-C. The rows of holes 722, 732 are arranged in a row in a direction parallel to the longitudinal axis A-A. Each of the holes 722 of the first fluid inlet 720 have different diameters and are offset from one another in a circumferential direction such that a circumference 723 of each the holes 722 is tangential to an axis D-D, the axis D-D parallel to the longitudinal axis A-A. Each of the holes 732 of the second fluid inlet 730 have different diameters and are offset from one another in a circumferential direction such that a circumference 733 of each of the holes 732 is tangential to an axis E-E.

The holes 722, 732 have first and second inlet surfaces 721, 731 extending from the inner surface 712 to the outer surface 710 of the tubular body 704. The first and second inlet surfaces 721, 731 have a constant profile extending through the tubular body 704 along the first and second inlet axes B-B, C-C. Thus, the profiles of the first and second inlet surfaces 721, 731 are constant as they extend along the first and second inlet axes B-B, C-C. The first and second fluid inlets 720, 730 have an identical profile, including the diameters and arrangement of the holes 722, 732. In other embodiments, the profiles of the first and second fluid inlets 720, 730 may not be identical. Instead, the first and second fluid inlets 720, 730 may have different profiles to optimize mixing for factors such as different flow rates for the different fluids or other factors.

The first and second inlet axes B-B, C-C are spaced from the longitudinal axis A-A so that they do not intersect the longitudinal axis A-A. The first and second inlet axes B-B, C-C are parallel to one another and perpendicular to the longitudinal axis A-A. However, the first and second inlet axes B-B, C-C are located on opposite sides of the longitudinal axis A-A. Thus, the first and second inlet axes B-B, C-C are perpendicular but non-intersecting the longitudinal axis A-A. In other embodiments, the first and second inlet axes B-B, C-C are not parallel with each other. In yet other embodiments, the first and second inlet axes B-B, C-C may not be perpendicular to the longitudinal axis A-A. In these embodiments, the first and second inlet axes B-B, C-C may be perpendicular to the longitudinal axis A-A and non-parallel with each other. In these embodiments, it is also possible that the first and second inlet axes B-B, C-C may not be perpendicular to the longitudinal axis A-A but may be parallel to one another.

The first and second fluid inlets 720, 730 have first and second inlet surfaces 721, 731 as discussed above. In this embodiment, the first and second fluid inlets 720, 730 are identical and rotationally symmetric about the longitudinal axis A-A. The first and second fluid inlets 720, 730 extend a substantial entirety of the length of the groove surface 716 along the longitudinal axis A-A. A portion of the first inlet surface 721 of each of the holes 722 joins the inner surface 712. More specifically, the portion of the first inlet surface 721 meets the inner surface 712 at a point of tangency 723. Thus, the portion of the first inlet surface 721 is tangent to the inner surface 712, with the two surfaces meeting at the point of tangency 723. Said differently, there are no discontinuities between the portion of the first inlet surface 721 and the inner surface 712 as the portion joins the inner surface 712.

The second inlet surface 731 also has a portion which joins the inner surface 712 tangentially, with a corresponding point of tangency. The flange 702 of the mixing element 700 further comprises a flange groove 752 and a flange surface 754. The flange groove 752 is formed into the flange surface 754 to permit assembly of the mixing element 700 with an assembly port 147 and provide effective sealing of the assembly port 147. More specifically, the flange groove 752 is configured to receive the annular rib 149 within each of the assembly ports 147.

Turning to FIGS. 30-33, another embodiment of a mixing element 800 is described herein. The mixing element 800 is similar to the mixing element 200 with the exception of features noted below. The mixing element 800 has a flange 802 and a tubular body 804. The tubular body 804 extends along a longitudinal axis A-A from a closed end 806 to an open end 808. The tubular body 804 further comprises an outer surface 810 and an inner surface 812. Each of the outer surface 810 and the inner surface 812 extend from the closed end 806 to the open end 808. The inner surface 812 has a non-constant diameter along the longitudinal axis A-A. In other words, the inner surface 812 varies in diameter. The inner surface 812 has a plurality of grooves 817, each of the grooves 817 having a first diameter D1. In between the grooves 817, the inner surface 812 has a second diameter D2, the first diameter D1 being greater than the second diameter D2. In other embodiments, the inner surface 812 may have more than two different diameters, may vary continuously in at least a portion, or may have any other internal shape as desired. The outer surface 810 of the tubular body 804 has a first sealing surface 814 proximate the closed end 806 and a second sealing surface 818 proximate the open end 808. The first and second sealing surfaces 814, 818 may have different diameters or may have the same diameter.

A groove surface 816 extends between the first and second sealing surfaces 814, 818. The groove surface 816 may have a diameter that is smaller than the diameters of the first and second sealing surfaces 814, 818. The groove surface 816 need not have a constant diameter, and may have variations in the diameter with respect to the longitudinal axis. In some embodiments, the groove surface 816 may have portions which are the same diameter as one of the first or second sealing surfaces 814, 818. In yet other embodiments, the groove surface 816 may be omitted entirely.

The mixing element 800 comprises a first fluid inlet 820, a second fluid inlet 830, and a fluid outlet 840. The first and second fluid inlets 820, 830 are formed through the tubular body 804 from the outer surface 810 to the inner surface 812. More specifically, the first and second fluid inlets 820, 830 are formed in the groove surface 816 of the outer surface 810. The fluid outlet 840 is formed by the open end 808. Thus, fluid flows through the first and second fluid inlets 820, 830, along the inside of the tubular body 804, and out of the fluid outlet 840.

The first and second fluid inlets 820, 830 are each formed as a row of holes 822, 832 which extend along first and second inlet axes B-B, C-C. The rows of holes 822, 832 are arranged in a row in a direction parallel to the longitudinal axis A-A. Each of the holes 822 of the first fluid inlet 820 have the same diameter. Each of the holes 832 of the second fluid inlet 830 have the same diameter. Each of the holes 822, 832 is aligned with one of the grooves 817 on the inner surface 812. In other embodiments, the holes 822, 832 may be offset from the grooves 817.

The holes 822, 832 have first and second inlet surfaces 821, 831 extending from the inner surface 812 to the outer surface 810 of the tubular body 804. The first and second inlet surfaces 821, 831 have a constant profile extending through the tubular body 804 along the first and second inlet axes B-B, C-C. Thus, the profiles of the first and second inlet surfaces 821, 831 are constant as they extend along the first and second inlet axes B-B, C-C. The first and second fluid inlets 820, 830 have an identical profile, including the diameters and arrangement of the holes 822, 832. In other embodiments, the profiles of the first and second fluid inlets 820, 830 may not be identical. Instead, the first and second fluid inlets 820, 830 may have different profiles to optimize mixing for factors such as different flow rates for the different fluids or other factors.

The first and second inlet axes B-B, C-C are spaced from the longitudinal axis A-A so that they do not intersect the longitudinal axis A-A. The first and second inlet axes B-B, C-C are parallel to one another and perpendicular to the longitudinal axis A-A. However, the first and second inlet axes B-B, C-C are located on opposite sides of the longitudinal axis A-A. Thus, the first and second inlet axes B-B, C-C are perpendicular but non-intersecting the longitudinal axis A-A. In other embodiments, the first and second inlet axes B-B, C-C are not parallel with each other. In yet other embodiments, the first and second inlet axes B-B, C-C may not be perpendicular to the longitudinal axis A-A. In these embodiments, the first and second inlet axes B-B, C-C may be perpendicular to the longitudinal axis A-A and non-parallel with each other. In these embodiments, it is also possible that the first and second inlet axes B-B, C-C may not be perpendicular to the longitudinal axis A-A but may be parallel to one another.

The first and second fluid inlets 820, 830 have first and second inlet surfaces 821, 831 as discussed above. In this embodiment, the first and second fluid inlets 820, 830 are identical and rotationally symmetric about the longitudinal axis A-A. The first and second fluid inlets 820, 830 extend a substantial entirety of the length of the groove surface 816 along the longitudinal axis A-A. A portion of the first inlet surface 821 of each of the holes 822 joins the inner surface 812. More specifically, the portion of the first inlet surface 821 meets the inner surface 812 at a point of tangency. Thus, the portion of the first inlet surface 821 is tangent to the inner surface 812, with the two surfaces meeting at the point of tangency. Said differently, there are no discontinuities between the portion of the first inlet surface 821 and the inner surface 812 as the portion joins the inner surface 812.

The second inlet surface 831 also has a portion which joins the inner surface 812 tangentially, with a corresponding point of tangency. The flange 802 of the mixing element 800 further comprises a flange groove 852 and a flange surface 854. The flange groove 852 is formed into the flange surface 854 to permit assembly of the mixing element 800 with an assembly port 147 and provide effective sealing of the assembly port 147. More specifically, the flange groove 852 is configured to receive the annular rib 149 within each of the assembly ports 147.

Figure 34:
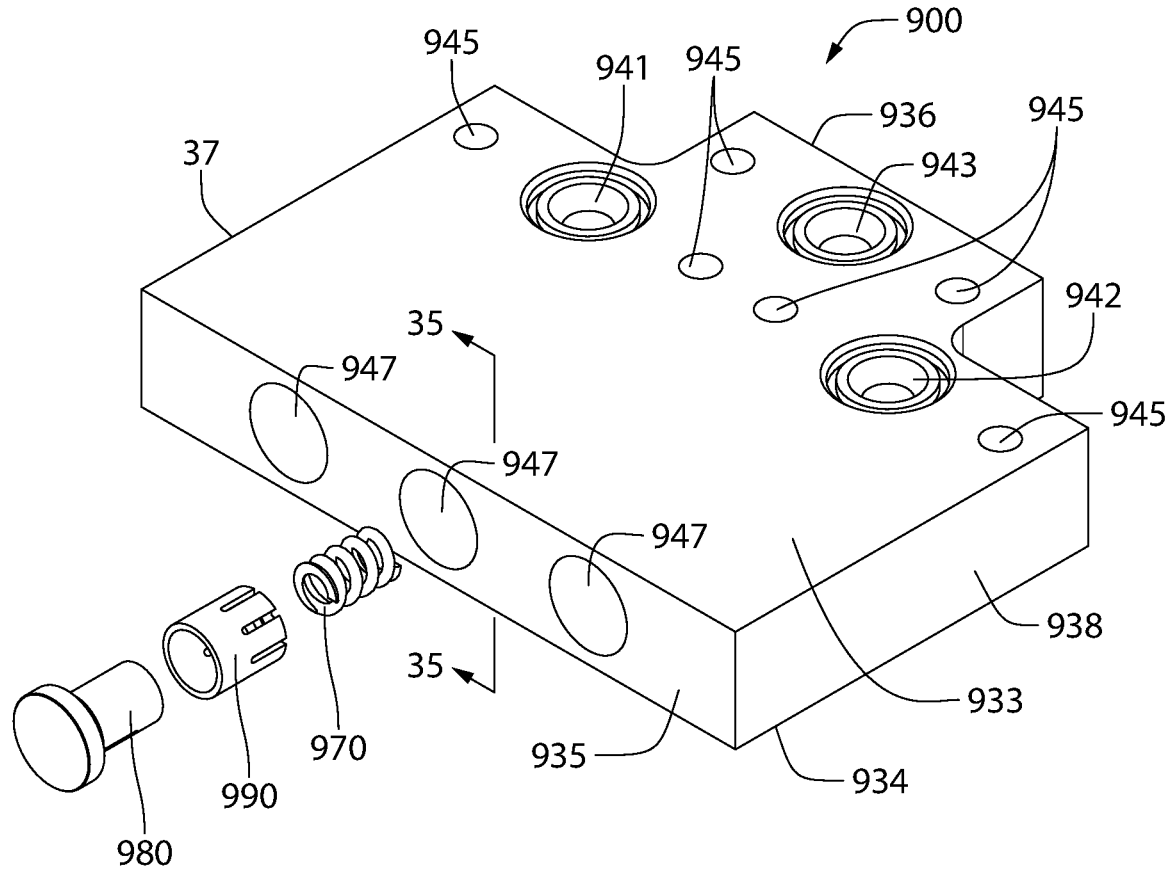
FIG. 34 is an exploded perspective view of another embodiment of a flow component as may be utilized in the fluid delivery module of FIG. 2.
Figures 35, 36:
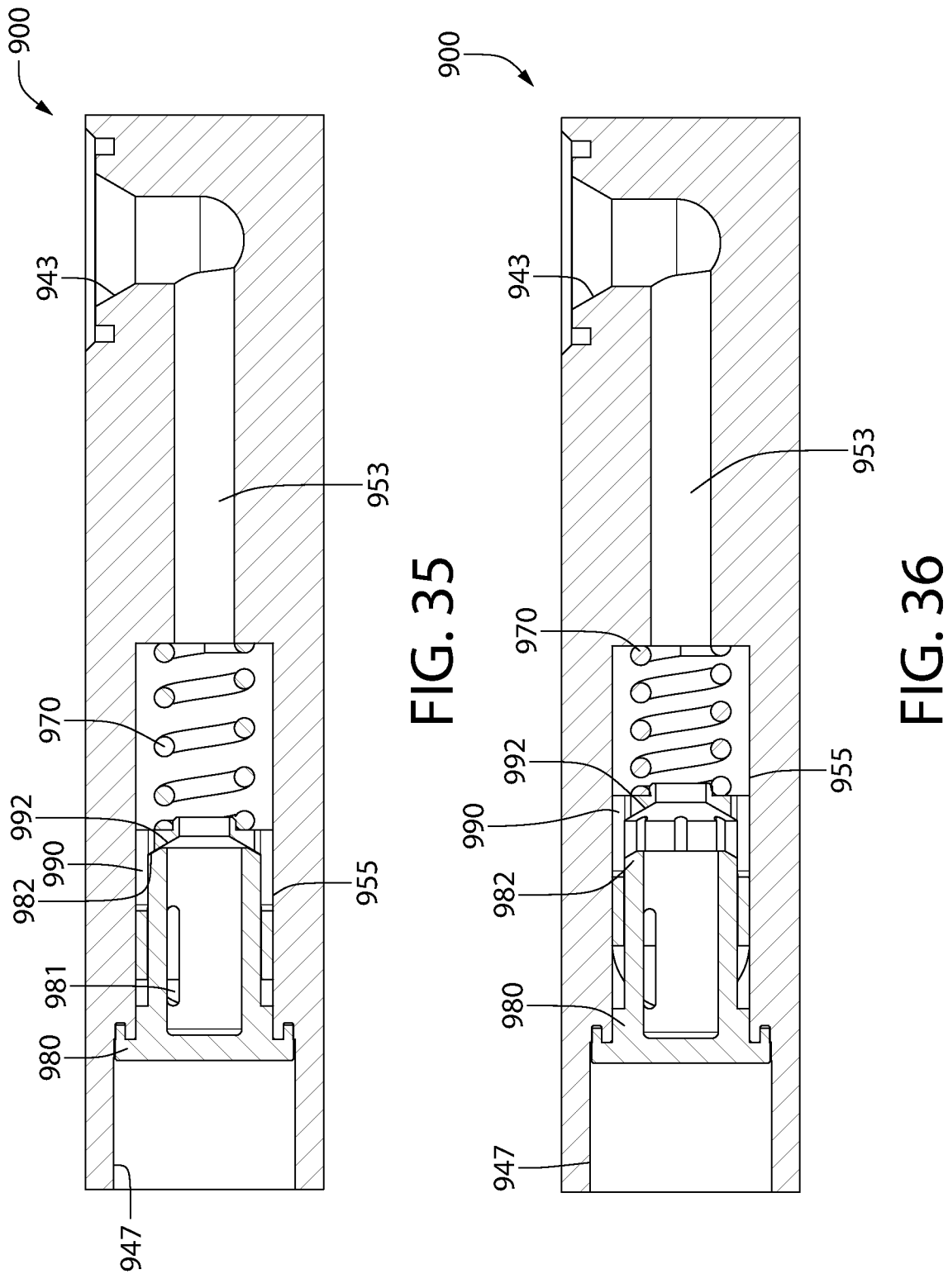
FIG. 35 is a cross-sectional view of the flow component of FIG. 34 in a first state.
FIG. 36 is a cross-sectional view of the flow component of FIG. 34 in a second state.
Figure 37:
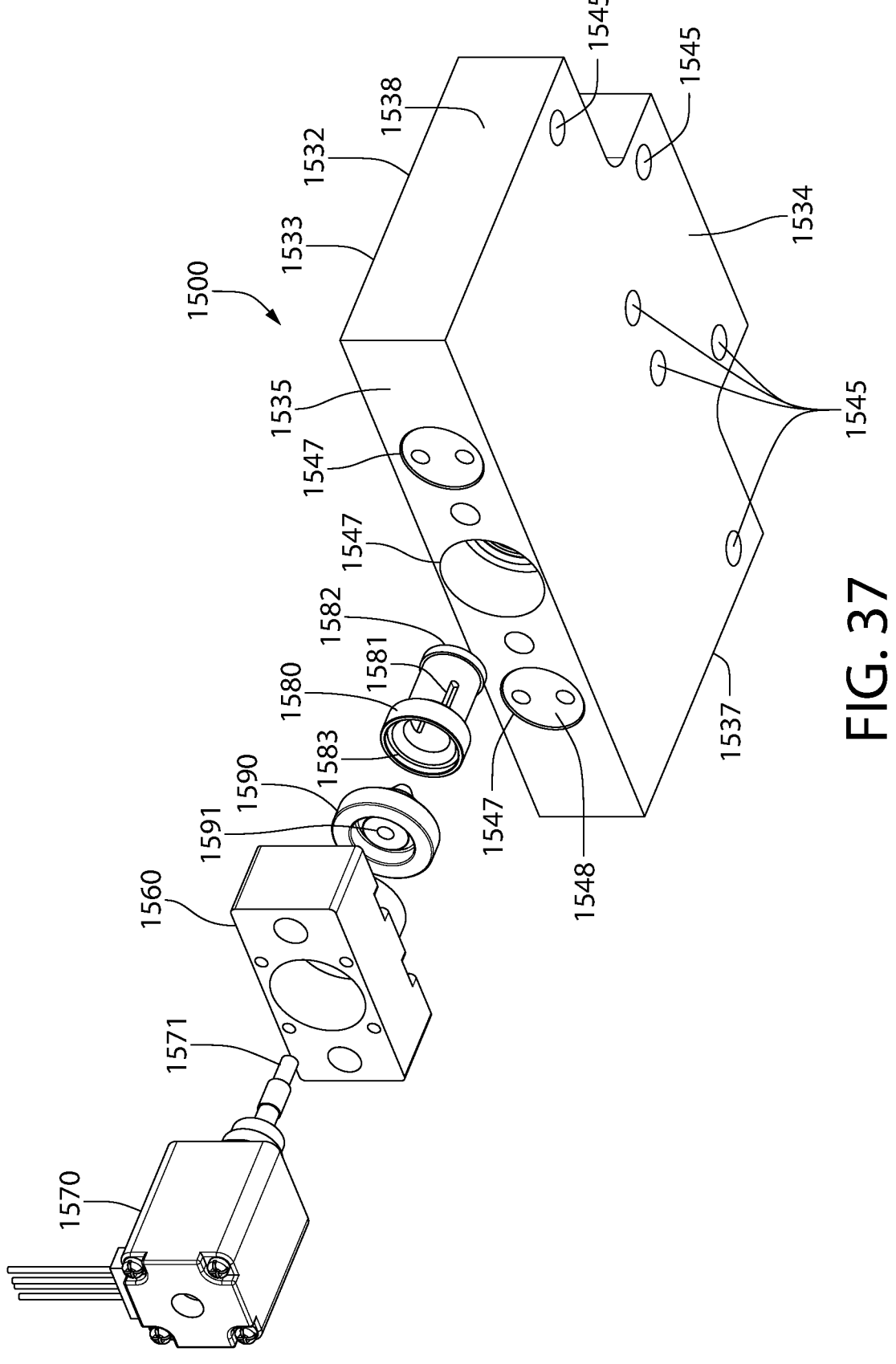
FIG. 37 is an exploded bottom perspective view of another embodiment of a flow component as may be utilized in the fluid delivery module of FIG. 2.

Turning to FIGS. 34-36, another embodiment of the fluid flow component 900 is illustrated. The fluid flow component 900 is similar to the fluid flow component 130 discussed above. The fluid flow component 900 has a component body 932, the component body 932 having a top surface 933, bottom surface 934, front surface 935, rear surface 936, left surface 937, and right surface 938. As can be seen, the rear surface 936 is not planar, but instead comprises a projection which extends from adjacent portions of the rear surface 936.

The top surface 933 of the component body 932 comprises a first port 941, a second port 942, and a third port 943. The first and second ports 941, 942 are configured to receive fluid while the third port 943 is configured to output fluid. However, in some embodiments, different ones of the first, second, and third ports 941, 942, 943 may serve as inlets and outlets. In addition, it is conceived that there may be more than three ports to facilitate combining more than two fluids or splitting one or more fluids. Each of the ports 941, 942, 943 comprises a seal cavity which is configured to receive a seal to facilitate connection with other components. The component body 932 further comprises a plurality of fastener passageways 945 that facilitate attachment of the component body 932 to the support structure 1402. In addition, the fastener passageways 945 can facilitate attachment of other flow components 110, 120 to the component body 932. The fastener passageways 945 may be through holes, threaded holes, or may be formed in any manner that permits attachment.

The bottom surface 934 of the component body 932 is configured to be in physical contact with the top surface 1403 of the support structure 1402 when the fluid flow component 930 is mounted to the support structure 1402. However, in other embodiments, the top surface 1403 may face the top surface 933 if the fluid flow component 930 is attached to another fluid flow component 110, 120, this fluid flow component 110, 120 being directly coupled to the support structure 1402.

The front surface 935 and the left surface 937 collectively comprise a plurality of assembly ports 947. Each of the assembly ports 947 is secured by a retention component such as the retention component 148. The retention component provides a fluid-tight seal for the assembly ports 947 and retains any components installed in the assembly ports 947. FIG. 34 illustrates a mixing element 980, flow control element 990, and a biasing element 970. The mixing element 980 is secured to the assembly port 947 by a retention component. The mixing element 980 fits within the flow control element 990, and the biasing element 970 engages the flow control element 990.

FIG. 35 illustrates a cross-section of the fluid flow component 900 in the assembled condition. The fluid flow component 900 has a third flow path 953 extending from the third port 143 to a junction 955. The mixing element 980 is located at the junction 955. Thus, fluid can flow from the junction 955 through the third flow path 953 to the third port 143. As shown, the flow control element 990 is in a first state. In the first state, the flow control element 990 partially obstructs fluid inlets 981 of the mixing element 980. This results in improved mixing for low flow conditions. The biasing element 970 maintains the flow control element 990 in the first state. In the first state, the flow control element 990 is axially biased against the mixing element 980, with the flow control element 990 acting as a slide valve to obscure the fluid inlets 981 of the mixing element 980. An open end 982 of the mixing element 980 is in contact with a seating surface 992 of the flow control element 990, limiting the volume of fluid which can flow through the fluid inlets 981.

FIG. 36 illustrates a cross-section of the fluid flow component 900 in the second state. In the second state, the flow control element 990 is axially translated so that the open end 982 of the mixing element 980 is no longer in contact with the seating surface 992 of the flow control element 990. This compresses the biasing element 970 and reduces the obstruction of the fluid inlets 981, allowing increased flow through the fluid inlets 981. This increased flow is achieved by the increasing flow. The flow control element 990 is forced into the second state by an increased pressure drop resulting from higher flow rates delivered to the fluid flow component 900. This increased pressure drop across the flow control element 990 and mixing element 980 forces the flow control element 990 against the biasing element 970 and opens the fluid inlets 981.

Turning to FIGS. 37-39B, yet another embodiment of a fluid flow component 1500 is disclosed. The fluid flow component 1500 is an active component capable of actively altering the fluid flow via external control inputs. The fluid flow component 1500 has a component body 1532, the component body 1532 having a top surface 1533, bottom surface 1534, front surface 1535, rear surface 1536, left surface 1537, and right surface 1538. As can be seen, the rear surface 1536 is not planar, but instead comprises a projection which extends from adjacent portions of the rear surface 1536.

The component body 1532 further comprises a plurality of fastener passageways 1545 that facilitate attachment of the component body 1532 to the support structure 1402. In addition, the fastener passageways 1545 can facilitate attachment of other flow components 110, 120 to the component body 1532. The fastener passageways 1545 may be through holes, threaded holes, or may be formed in any manner that permits attachment.

The bottom surface 1534 of the component body 1532 is configured to be in physical contact with the top surface 1403 of the support structure 1402 when the fluid flow component 1530 is mounted to the support structure 1402. However, in other embodiments, the top surface 1403 may face the top surface 1533 if the fluid flow component 1530 is attached to another fluid flow component 110, 120, this fluid flow component 110, 120 being directly coupled to the support structure 1402.

The front surface 1535 and the left surface 1537 collectively comprise a plurality of assembly ports 1547. The assembly ports 1547 may be closed by a retention component 1548. The retention component 1548 helps ensure a fluid-tight seal for the assembly ports 1547 and retains any components installed in the assembly ports 1547. The fluid flow component 1500 also comprises a mixing element 1580, flow control element 1590, an actuator 1570, and an adapter 1560. The mixing element 1580 is inserted into the assembly port 1547 first, then the flow control element 1590 is inserted into a second end 1583 of the mixing element 1580. The second end 1583 of the mixing element 1580 is closed as a result of the flow control element 1590 capping the second end 1583 of the mixing element 1580. A first end 1582 is open and forms a fluid outlet of the mixing element 1580. Between the first and second ends 1582, 1583, fluid inlets 1581 are formed through the mixing element 1580.

The flow control element 1590 is secured into the assembly port 1547 by the adapter 1560 and the actuator 1570 is coupled to the adapter 1560. The actuator 1570 may be a solenoid, linear actuator, or other device which moves in response to a control input. This control input may be applied via pneumatic or hydraulic pressure, electricity, or any other known means. In one example, the actuator 1570 may be a linear actuator, with an actuator rod 1571 configured to engage an actuator receptacle 1591 in the flow control element 1590. The flow control element 1590 is configured to selectively obstruct the fluid inlets 1581 as a result of force applied by the actuator rod 1571 on the actuator receptacle 1591.

Figure 38:
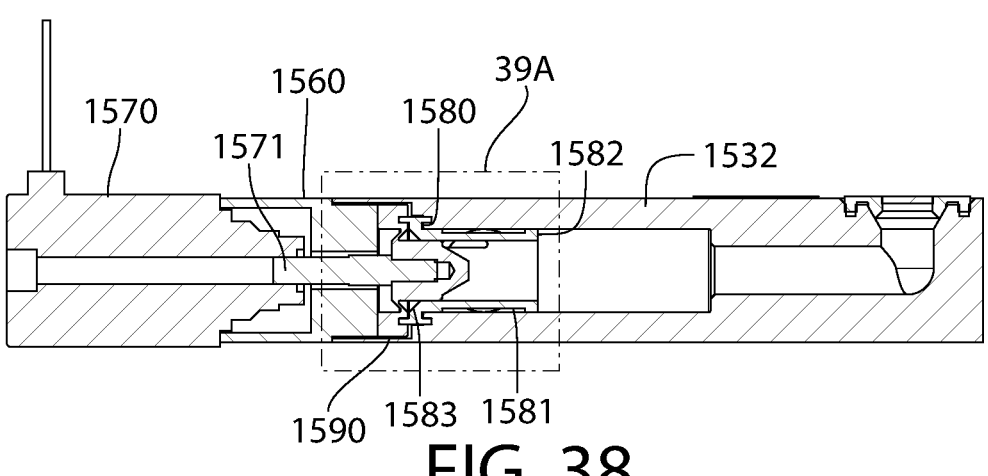
FIG. 38 is a cross-sectional view of the flow component of FIG. 37.
Figure 39A:
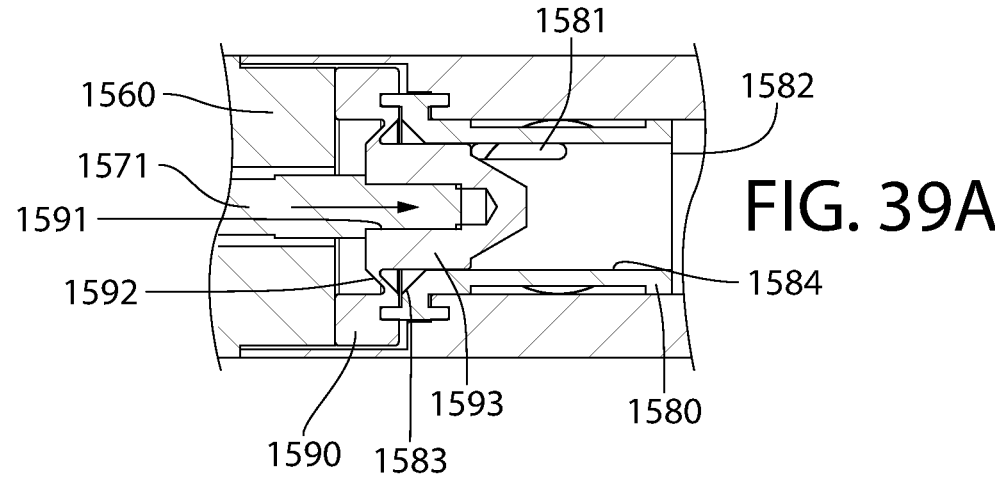
FIG. 39A is a detail view of the area 39A as shown in FIG. 38, the flow component being in a first state.
Figure 39B:
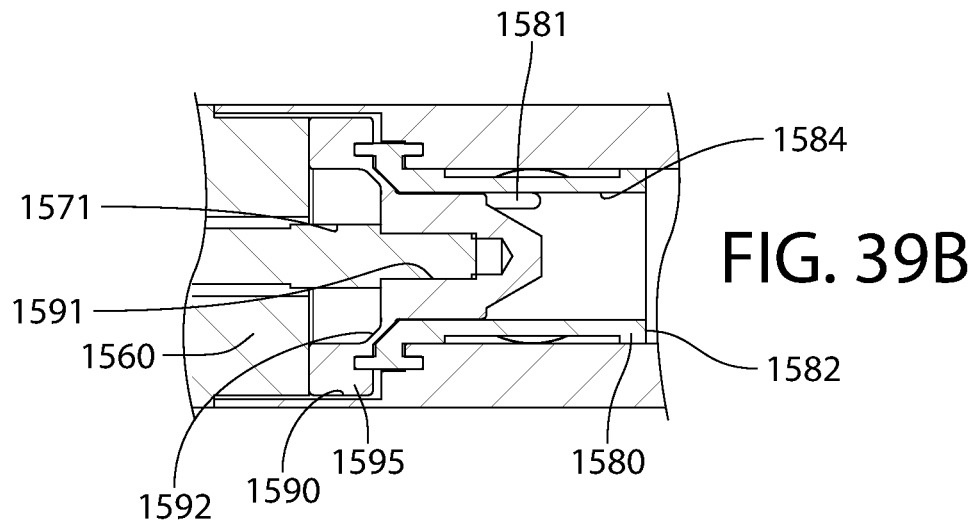
FIG. 39B is a detail view of the area 39A as shown in FIG. 38, the flow component being in a second state.

FIG. 38 illustrates a cross-section of the fluid flow component 1500 in the assembled condition. FIGS. 39A and 39B show detailed views of the fluid flow component 1500 in first and second states. In the first state, the flow control element 1590 does not obstruct the fluid inlets 1581 as shown. The actuator rod 1571 is coupled to the actuator receptacle 1591 to allow movement of a piston 1593 along an inner surface 1584 of the mixing element 1580. The piston 1593 is coupled to an outer ring 1595 via a diaphragm 1592. The diaphragm 1592 allows linear movement of the piston 1593 while the outer ring 1595 is fixed within the assembly port 1547.

In the first state, the piston 1593 is retracted by the actuator rod 1571. The fluid inlets 1581 are unobstructed. The fluid inlets 1581 allow fluid flow and mixing to occur as discussed above. When the fluid flow requirements are reduced, improved mixing can be achieved by partially obstructing the fluid inlets 1581. Thus, in the second state, the piston 1593 obstructs the fluid inlets 1581 as it is axially translated within the inner surface 1584 of the mixing element 1580.

A method of mixing process fluids is disclosed. In the method of mixing, a first fluid supply is configured to supply a first process fluid. A second fluid supply is configured to supply a second process fluid. The first process fluid is flowed through a flow passage to a mixing element located at a junction of a first flow component. The second process fluid is also flowed through the flow passage to the mixing element of the first flow component. The first and second process fluids are flowed through the first and second fluid inlets formed in the tubular body of the mixing element. The first and second process fluids flow through first and second inlet axes perpendicular to a longitudinal axis of the mixing element. The first and second process fluids mix as they pass along the tubular body to form a fluid mixture. The fluid mixture is then flowed through an open end of the tubular body, the open end forming an outlet of the mixing element.

Optionally, the fluid inlets may be selectively obstructed based on parameters such as fluid flow rates to facilitate improved mixing. The first and second process fluids may or may not be different.

While the invention has been described with respect to specific examples including presently preferred modes of carrying out the invention, those skilled in the art will appreciate that there are numerous variations and permutations of the above-described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A system for processing articles, the system comprising:
   a first fluid supply configured to supply a first process fluid;
   a second fluid supply configured to supply a second process fluid;
   a process chamber configured to process articles;
   a fluid delivery module, the fluid delivery module comprising:
      a first inlet fluidly coupled to the first fluid supply;
      a second inlet fluidly coupled to the second fluid supply;
      an outlet fluidly coupled to the process chamber;
      a flow passage extending from the first and second inlets to the outlet;
      a first flow component, the first flow component comprising:
         a component body;
         a first port, a second port, and a third port, each of the first, second, and third ports formed in the component body, a first flow path extending from the first port to a junction, a second flow path extending from the second port to the junction, and a third flow path extending from the junction to the third port, the first, second, and third flow paths each forming a portion of the flow passage; and
         a mixing element, the mixing element located at the junction of the first flow component, the mixing element comprising a first fluid inlet, a second fluid inlet, and a fluid outlet, the first fluid inlet fluidly coupled to the first port, the second fluid inlet fluidly coupled to the second port, and the fluid outlet fluidly coupled to the third port.

2. The system of claim 1 wherein the mixing element comprises a tubular body, the tubular body extending along a longitudinal axis of the mixing element from an open end to a closed end, wherein the tubular body comprises an outer surface and an inner surface, and wherein both the outer surface and the inner surface extend from the open end to the closed end.

3. The system of claim 2 wherein the first and second fluid inlets of the mixing element extend from the outer surface to the inner surface.

4. The system of claim 2 wherein the open end of the tubular body forms the fluid outlet of the mixing element.

5. The system of claim 2 wherein the outer surface comprises a first sealing surface proximate the closed end, a second sealing surface proximate the open end, and a groove surface extending from the first sealing surface to the second sealing surface, and wherein the first fluid inlet and the second fluid inlet are formed into the groove surface.

6. The system of claim 2 wherein the first fluid inlet extends along a first inlet axis, the first inlet axis perpendicular to the longitudinal axis, wherein the first inlet axis does not intersect the longitudinal axis.

7. The system of claim 2 wherein the first fluid inlet has a first inlet surface, the first inlet surface extending from the outer surface to the inner surface, wherein the first inlet surface meets the inner surface at a point of tangency, the first inlet surface being tangent to the inner surface at the point of tangency.

8. The system of claim 2 wherein the mixing element comprises a flange at the closed end.

9. The system of claim 1 wherein the first flow component comprises a first assembly port, the mixing element and a retention component installed in the first assembly port.

10. The system of claim 9 wherein the first assembly port of the first flow component comprises an annular rib and the mixing element comprises a flange at a closed end, the flange comprising a flange groove configured to receive the annular rib of the first flow component.

11. A mixing element, the mixing element comprising:
a tubular body extending along a longitudinal axis of the mixing element from an open end to a closed end, the tubular body having an outer surface and an inner surface;
a first fluid inlet formed through the tubular body from the outer surface to the inner surface;
a second fluid inlet formed through the tubular body from the outer surface to the inner surface; and
a fluid outlet formed by the open end of the tubular body, wherein the outer surface comprises a first sealing surface proximate the closed end, a second sealing surface proximate the open end, and a groove surface extending from the first sealing surface to the second sealing surface; and wherein the first fluid inlet and the second fluid inlet are formed into the groove surface.

12. The mixing element of claim 11 wherein both the outer surface and the inner surface extend from the open end to the closed end.

13. The mixing element of claim 11 wherein the first fluid inlet extends along a first inlet axis, the first inlet axis perpendicular to the longitudinal axis, and wherein the first inlet axis is spaced from the longitudinal axis.

14. The mixing element of claim 13 wherein the first inlet axis does not intersect the longitudinal axis.

15. The mixing element of claim 13 wherein the second fluid inlet extends along a second inlet axis, the second inlet axis parallel to the first inlet axis and perpendicular to the longitudinal axis, and wherein the second inlet axis does not intersect the longitudinal axis.

16. The mixing element of claim 11 wherein the first fluid inlet has a first inlet surface, the first inlet surface extending from the outer surface to the inner surface.

17. The mixing element of claim 11 wherein the first fluid inlet comprises a slot, the slot being elongate along the longitudinal axis.

18. A mixing element, the mixing element comprising:
a tubular body extending along a longitudinal axis of the mixing element from an open end to a closed end, the tubular body having an outer surface and an inner surface;
a first fluid inlet formed through the tubular body from the outer surface to the inner surface;
a second fluid inlet formed through the tubular body from the outer surface to the inner surface; and
a fluid outlet formed by the open end of the tubular body, wherein the first fluid inlet comprises a plurality of holes, wherein each hole of the plurality of holes has a diameter, the diameter of each hole of the plurality of holes being different, and wherein the diameters of the plurality of holes decrease with increasing distance from the closed end of the tubular body along the longitudinal axis.

* * * * *